United States Patent
Tao et al.

(10) Patent No.: US 12,074,245 B1
(45) Date of Patent: Aug. 27, 2024

(54) METHOD FOR MANUFACTURING PHOTOVOLTAIC MODULE AND PHOTOVOLTAIC MODULE

(71) Applicants: JINKO SOLAR CO., LTD., Jiangxi (CN); ZHEJIANG JINKO SOLAR CO., LTD., Zhejiang (CN)

(72) Inventors: Wusong Tao, Jiangxi (CN); Jun Feng, Jiangxi (CN); Heng Luo, Jiangxi (CN)

(73) Assignees: JINKO SOLAR CO., LTD., Jiangxi (CN); ZHEJIANG JINKO SOLAR CO., LTD., Haining Zhejiang (CN)

(*) Notice: Subject to any disclaimer, the term of this patent is extended or adjusted under 35 U.S.C. 154(b) by 0 days.

(21) Appl. No.: 18/458,074

(22) Filed: Aug. 29, 2023

(30) Foreign Application Priority Data

May 8, 2023 (CN) .......................... 202310512494.0
May 8, 2023 (CN) .......................... 202321089398.1

(51) Int. Cl.
| | | |
|---|---|---|
| H01L 31/048 | (2014.01) | |
| H01L 31/0224 | (2006.01) | |
| H01L 31/05 | (2014.01) | |
| H01L 31/18 | (2006.01) | |

(52) U.S. Cl.
CPC ...... *H01L 31/18* (2013.01); *H01L 31/022425* (2013.01); *H01L 31/048* (2013.01); *H01L 31/0504* (2013.01)

(58) Field of Classification Search
CPC ............. H01L 31/18; H01L 31/022425; H01L 31/048; H01L 31/0504
See application file for complete search history.

(56) References Cited

U.S. PATENT DOCUMENTS

| | | |
|---|---|---|
| 2008/0173698 A1 | 7/2008 | Marczi et al. |
| 2011/0315188 A1 * | 12/2011 | Hong .................. H01L 31/0512 136/244 |
| 2017/0365731 A1 | 12/2017 | Lin et al. |

FOREIGN PATENT DOCUMENTS

| | | | |
|---|---|---|---|
| CN | 111958084 A | 11/2020 | |
| CN | 115139015 A * | 10/2022 | ..... H01L 31/022425 |
| CN | 115632086 A | 1/2023 | |
| EP | 2688093 A1 | 1/2014 | |
| JP | 2019033279 A | 2/2019 | |
| KR | 20190061365 A | 6/2019 | |

OTHER PUBLICATIONS

Tao et al, CN 115139015 A, English Machine Translation. (Year: 2022).*
Jinko Solar Co., Ltd., et al., Extended European Search Report, EP 23192967.0, Jan. 25, 2024, 9 pgs.

* cited by examiner

*Primary Examiner* — Tae-Sik Kang
(74) *Attorney, Agent, or Firm* — USCH Law, PC

(57) ABSTRACT

Embodiments of the disclosure provide a method for manufacturing a photovoltaic module and a photovoltaic module. The method includes the following: providing a plurality of cells; selecting at least one cell from the plurality of cells, and for each respective cell of the at least one cell, forming a corresponding solder layer on each respective solder pad of at least one solder pad of the respective cell; and performing a soldering treatment on the respective connecting member and the at least one solder pad and/or the at least one solder layer to connect the respective pair of adjacent cells, wherein the soldering treatment has a heating temperature in a range of 200° C. to 300° C.

10 Claims, 4 Drawing Sheets

METHOD FOR MANUFACTURING PHOTOVOLTAIC MODULE AND PHOTOVOLTAIC MODULE

CROSS REFERENCE TO RELATED APPLICATIONS

The present application claims the benefit of priority under the Paris Convention to Chinese Patent Application No. 202321089398.1 filed on May 8, 2023 and Chinese Patent Application No. 202310512494.0 filed on May 8, 2023, each of which is incorporated herein by reference in its entirety.

TECHNICAL FIELD

The various embodiments described in this document relate in general to the technical field of solar cells, and more specifically to a method for manufacturing a photovoltaic module and the photovoltaic module.

BACKGROUND

Fossil energy has air pollution and limited reserves, while solar energy has advantages of cleanliness, no pollution, and abundant resources. Therefore, the solar energy is gradually becoming a core clean energy to replace the fossil energy. Since the solar cell has good photoelectric conversion efficiency, the solar cell has become the development focus of clean energy utilization.

The photovoltaic module includes at least one cell string, at least one encapsulation film, and at least one cover plate, where each cell string includes a plurality of cells electronically connected in sequence. Each cell has a plurality of solder pads. During preparing of cell strings, interconnection between adjacent cells is realized by electrically contacting selected connecting members with solder pads, thereby forming a cell string having a specific output power.

However, in current photovoltaic modules, false soldering or even unsoldering is easy to occur between connecting members and solder pads, and thus, reliability of the photovoltaic modules needs to be improved.

SUMMARY

In some embodiments, a method for manufacturing a photovoltaic module is provided and includes the following: providing a plurality of cells, where each cell of the plurality of cells includes a plurality of solder pads; selecting at least one cell from the plurality of cells, and for each respective cell of the at least one cell, forming a corresponding solder layer on each respective solder pad of at least one solder pad of the respective cell, wherein the corresponding solder layer includes a first alloy layer adjacent to the respective solder pad and a second alloy layer on a surface of the first alloy layer away from the respective solder pad, and the first alloy layer including a first alloy formed of tin and a metal element constituting the respective solder pad; and assembling a plurality of connecting members on pairs of adjacent cells, including placing each respective connecting member of the plurality of connecting members on at least one solder pad and/or at least one solder layer of each cell of a respective pair of adjacent cells, and performing a soldering treatment on the respective connecting member and the respective pair of adjacent cells to connect the respective pair of adjacent cells, wherein the soldering treatment has a heating temperature in a range of 200° C. to 300° C.

In some embodiments, a heating duration for the soldering treatment is in a range of 1.2 s to 1.9 s.

In some embodiments, forming the corresponding solder layer includes: coating each solder pad with molten solder for forming the corresponding solder layer after cooling.

In some embodiments, the molten solder is coated on each solder pad by using a tin feeder or a tinning machine.

In some embodiments, a heating temperature for forming the molten solder is in a range of 250° C. to 300° C.

In some embodiments, the method further includes: after forming the corresponding solder layer, slicing each cell to form at least two sub-cells, each sub-cell of the at least two sub-cells having at least one solder pad; and where assembling the plurality of connecting members includes: placing each respective connecting member on a corresponding solder pad and/or a corresponding solder layer of each sub-cell of two adjacent sub-cells; and performing a soldering treatment on the respective connecting member and two adjacent sub-cells (i.e., performing a soldering treatment on the respective connecting member and the corresponding solder layer and/or the corresponding solder pad) to connect the two adjacent sub-cells.

In some embodiments, forming the corresponding solder layer includes: forming the corresponding solder layer of a thickness in a range of 50 μm to 300 μm in a direction perpendicular to a surface of the respective cell.

In some embodiments, forming the corresponding solder layer includes: forming the corresponding solder layer having a thickness in a range of 0.5 times to 1.5 times a thickness of an adjacent insulating glue dot in the respective cell in a direction perpendicular to the surface of the respective cell.

In some embodiments, forming the corresponding solder layer includes: forming the corresponding solder layer, where an area of an orthographic projection of the corresponding solder layer on a surface of the respective cell is in a range of 15 square millimeters to 40 square millimeters.

In some embodiments, forming the corresponding solder layer includes: forming the corresponding solder layer, where a ratio of an area of an orthographic projection of the corresponding solder layer on a surface of a respective cell to an area of an orthographic projection of the respective solder pad where the corresponding solder layer is located on the surface of the respective cell is in a range of 0.25 to 0.6.

In some embodiments, a photovoltaic module is manufactured by the method described above and includes a first cover plate, a first encapsulation film, at least one cell string, a second encapsulation film, and a second cover plate which are stacked in sequence. Each cell string includes a plurality of cells and a plurality of connecting members; each respective cell of the plurality of cells has a plurality of solder pads, and for each respective cell of the at least one cell, a corresponding solder layer is formed after cooling of molten solder on each respective solder pad of at least one solder pad of the respective cell; and each respective connecting member of the plurality of connecting members is disposed on at least one solder pad and/or at least one solder layer of each cell of a respective pair of adjacent cells.

In some embodiments, each cell includes main bus bars, finger electrodes, and insulating glue spots that are formed on a surface of the cell, and each insulating glue dot is used for isolating a corresponding main bus bar and a corresponding finger electrode that have different polarities; and each solder layer has a thickness of 0.5 times to 1.5 times a thickness of a corresponding insulating glue dot in a direction perpendicular to the surface of the respective cell.

In some embodiments, each solder layer has a thickness in a range of 50 micrometre (μm) to 300 μm in a direction perpendicular to the surface of the respective cell.

In some embodiments, each solder layer includes a first alloy layer adjacent to a corresponding solder pad and a second alloy layer on a surface of the first alloy layer away from the corresponding solder pad, and a first alloy in the first alloy layer being an alloy formed of tin and a metal element constituting the corresponding solder pad.

In some embodiments, the second alloy layer includes at least one of a tin-lead alloy, a tin-silver alloy, a tin-copper alloy, a tin-lead-silver alloy, and a tin-bismuth alloy.

In some embodiments, the first alloy layer includes a silver-tin alloy layer, a copper-tin alloy layer, or a gold-tin alloy layer.

In some embodiments, the first alloy layer has a thickness in a range of 5 μm to 30 μm in a direction perpendicular to the surface of each cell.

In some embodiments, the second alloy layer is a tin-lead alloy layer, and a mass ratio of tin to lead in the tin-lead alloy layer is in a range of 0.25 to 1.

In some embodiments, an area of an orthographic projection of each solder pad on a surface of a respective cell is a first area, an area of an orthographic projection of a corresponding solder layer on the surface of the respective cell is a second area, and a ratio of the second area to the first area is in a range of 0.25 to 0.6.

In some embodiments, an area of an orthographic projection of each solder layer on a surface of a respective cell is in a range of 15 square millimeters to 40 square millimeters.

In some embodiments, each connecting member includes a conductive core and a wrapping layer covering the conductive core, and the wrapping layer has a thickness in a range of 5 μm to 10 μm in a direction perpendicular to a surface where the conductive core is in contact with the wrapping layer.

BRIEF DESCRIPTION OF THE DRAWINGS

One or more embodiments are illustrated by the figures in the corresponding drawings, which are not to be limiting to the embodiments, and the figures in the drawings are not to be limiting to scale unless specifically stated.

DETAILED DESCRIPTION OF THE EMBODIMENTS

Figure 1:
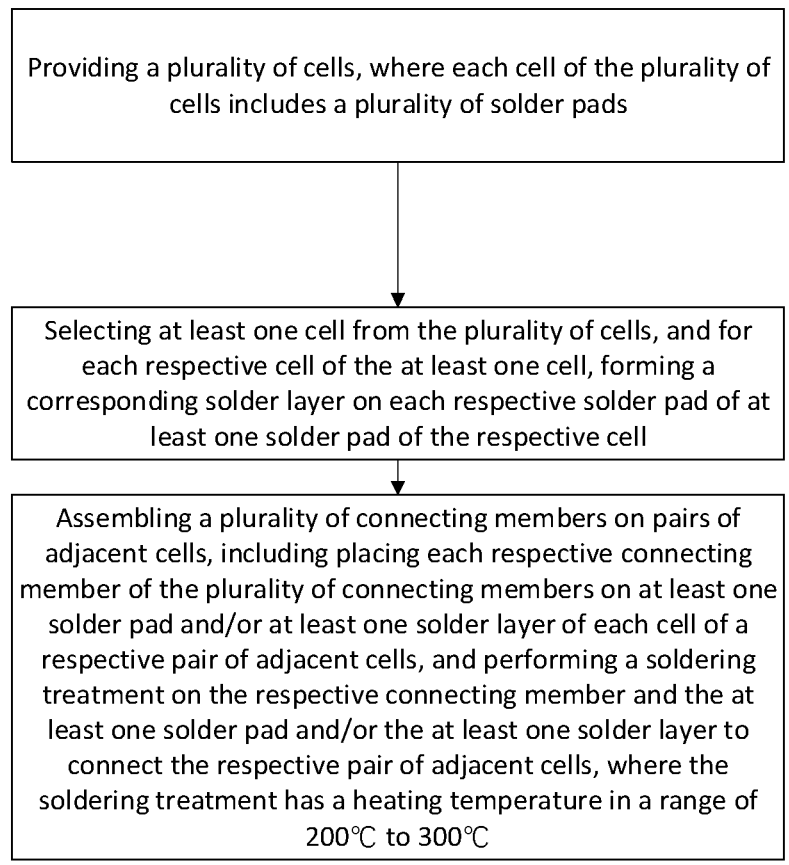
FIG. 1 is a flow chart of a method for manufacturing a photovoltaic module according to embodiments of the present disclosure.

At present, during manufacturing of cell strings for photovoltaic modules, connecting members are generally used to connect adjacent cells. The connecting members and cells are connected by electrically contacting the connecting members with the solder pads on the cells. The process adopted for the electrically contacting is as follows. The connecting members are heated and melted, and the melted connecting members form electrical contact with the solder pads. In order to ensure the safety of each cell, insulating glue may be printed in a specific region on the cell, and insulation between main bus bars and secondary grid lines (i.e., finger electrodes) with different polarities may be ensured through printed insulating glue dots. During preparation of the cell strings, after each connecting member is laid on the surface of each of corresponding cells, the connecting members are easily elevated by insulating glue dots, resulting in a large spacing between each connecting members and a corresponding solder pad, and thus, false soldering is easy to occur during establishing of electrical contact between the solder pads and the connecting members.

One solution is that solder paste is first printed on the solder pads during welding, and the spacing between the connecting members and the solder pads are shortened by the solder paste, so as to reduce the probability of false soldering between the connecting members and the solder pads. However, during preparing of cells with this scheme, the cost of the solder paste is high, and batch use may lead to an increase in the cost of photovoltaic modules. In addition, the amount of the solder paste is difficult to control and the solder paste is easy to shift, and conductive foreign matters such as solder paste and tin slag are easy to produce in subsequent treatments, which may affect the safety of the photovoltaic modules.

Embodiments of the disclosure provide a method for manufacturing a photovoltaic module and the corresponding manufactured photovoltaic module. During manufacturing of each cell string, a plurality of provided cells are pre-treated, at least part (at least one cell) of the cells are selected, and each solder layer including a first alloy layer and a second alloy layer is formed on a corresponding solder pad of at least part of the solder pads on each cell of the selected cells, where a first alloy of the first alloy layer is an alloy formed of tin and a metal element forming the solder pad. Thereafter, each connecting member is placed on a plurality of solder layers and/or solder pads on each cell of the adjacent cells, and interconnection of the adjacent cells is realized by soldering treatment with a heating temperature ranging from 200° C. to 300° C. By forming each solder layer on the corresponding solder pad of the at least part of the solder pad in advance, the spacing between each connecting member and the corresponding solder pad is shortened by using the solder layer, the stability of the connection and the reliability of the electrical connection between the solder pad and the connecting member are improved, and the probability of false soldering between the connecting member and the solder pad is reduced. The pre-formed solder layer includes a first alloy layer, which reduces the heating temperature in the subsequent welding process, makes the heating temperature for the welding process in the range of 200° C. to 300° C., reduces the probability of performance damage of the cell caused by the high temperature during the welding as much as possible, reduces the possibility of forming conductive foreign matter on the surface of the cell, and reduces the process risk in the preparation process of the photovoltaic module, thereby improving the reliability and safety of the photovoltaic module.

The embodiments of the disclosure will be described in detail below with reference to the accompanying drawings.

However, those of ordinary skill in the art can understand that, in various embodiments of the disclosure, many technical details are set forth in order to provide the reader with a better understanding of the disclosure. However, the technical solutions claimed in the disclosure may be realized even without these technical details and various changes and modifications based on the following embodiments.

Figure 2:
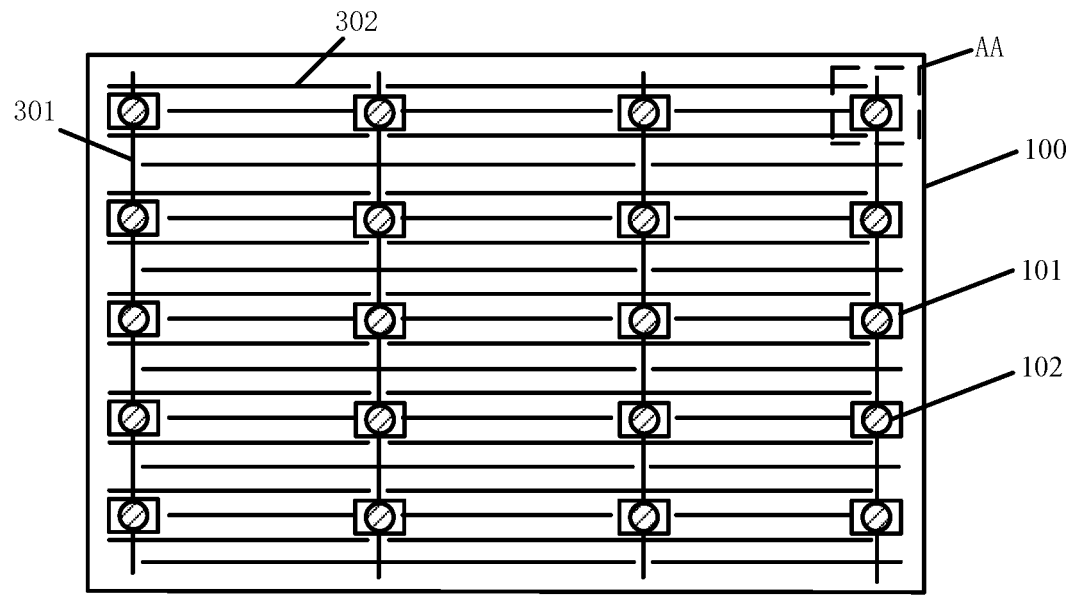
FIG. 2 is a top view of a cell according to embodiments of the present disclosure.
Figure 3A:
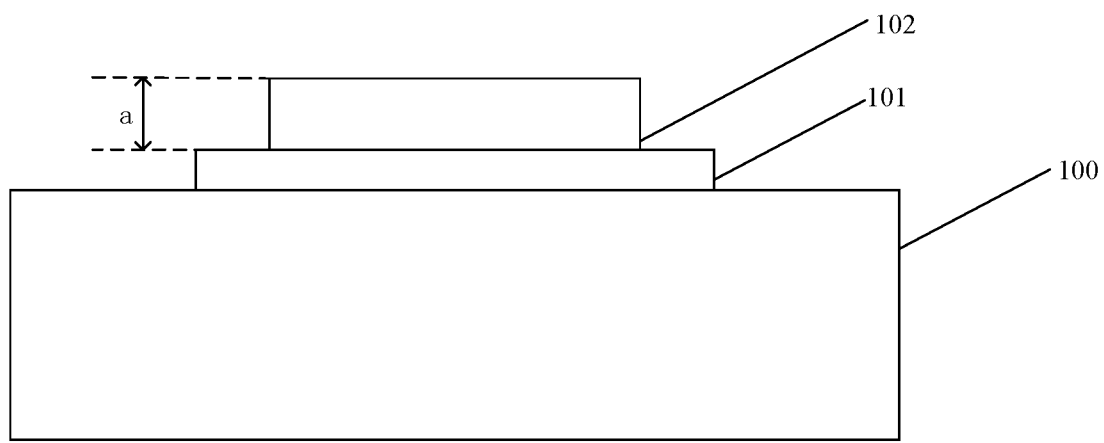
FIG. 3A is a partial sectional structural view of a cell according to embodiments of the present disclosure.
Figure 3B:
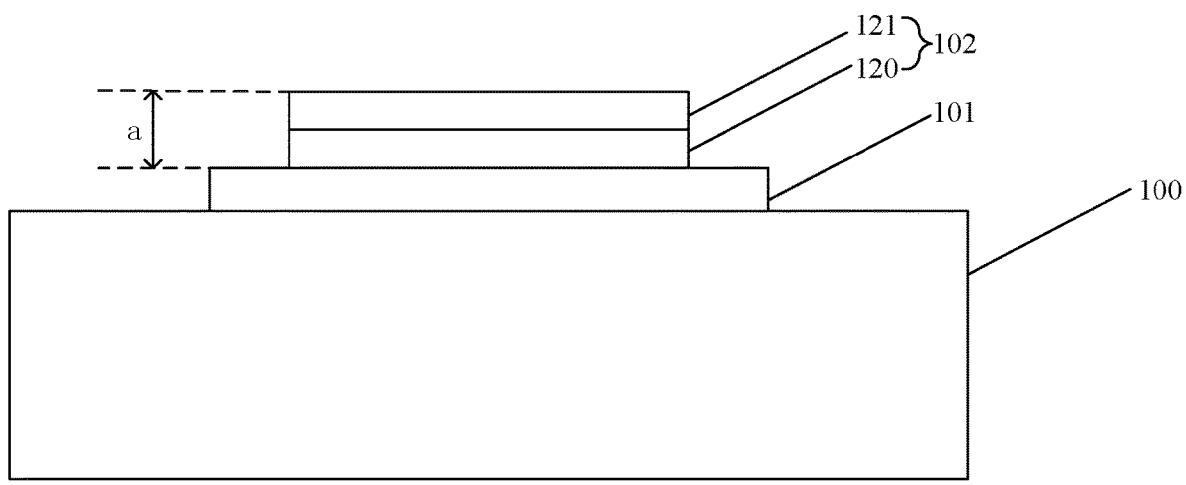
FIG. 3B is a partial sectional structural view of a cell according to other embodiments of the present disclosure.
Figure 4:
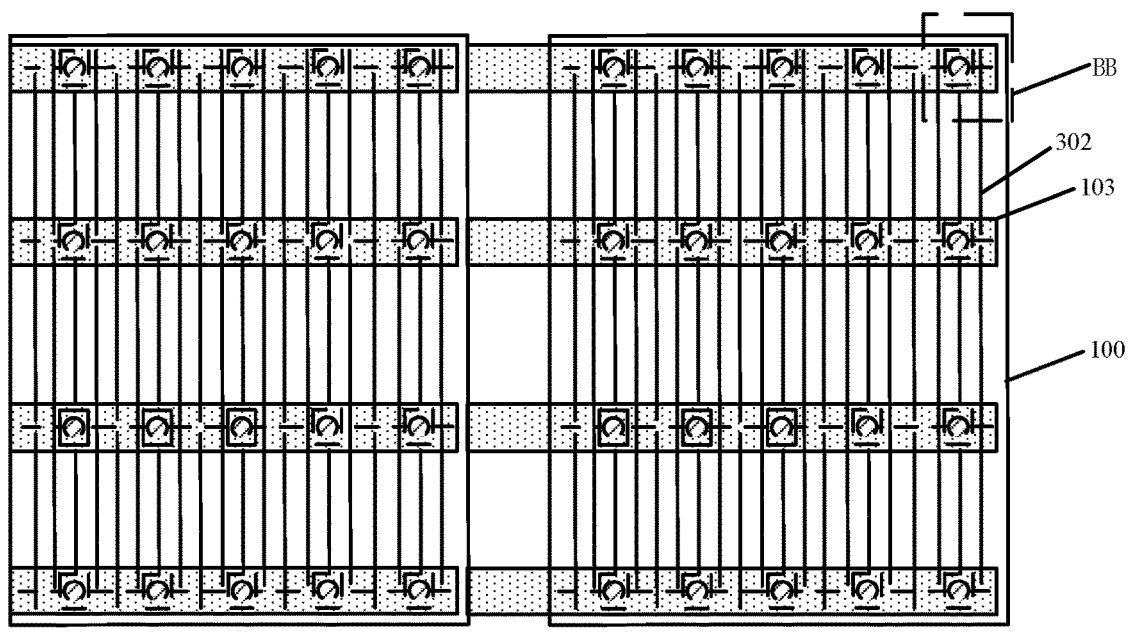
FIG. 4 is a partial structural view of a cell string according to embodiments of the present disclosure.
Figure 5:
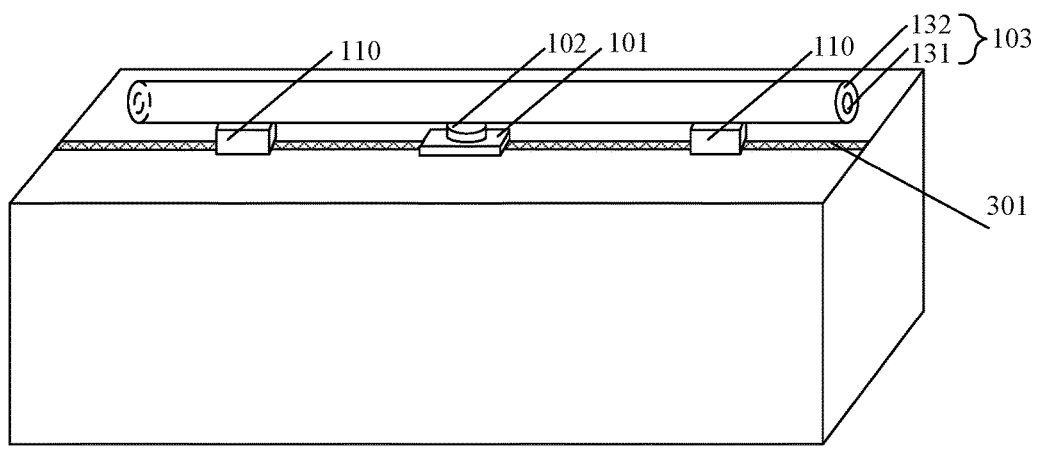
FIG. 5 is a partial three-dimensional schematic structural view of a cell string according to embodiments of the present disclosure.

Embodiments of the present disclosure provide a method for manufacturing a photovoltaic module. Referring to FIGS. 1 to 5, FIG. 1 is a flow chart of a method for manufacturing a photovoltaic module according to embodiments of the present disclosure, FIG. 2 is a top view of the cell after a solder layer being prepared, FIG. 3A is a partial sectional structural view of a cell according to other embodiments of the present disclosure, FIG. 3B is a partial sectional structural view of a AA region of the cell in a direction perpendicular to a surface of the cell when the solder layer includes a first alloy layer and a second alloy layer, FIG. 4 is a schematic structural view of two adjacent cells in a cell string, and FIG. 5 is a partial three-dimensional schematic view of a BB region in the cell string. The method for manufacturing the photovoltaic module at least includes following operations.

A plurality of cells 100 are provided, where each cell 100 of the plurality of cells 100 has a plurality of solder pads 101.

During manufacturing of each cell string, a plurality of cells 100 are provided, where grid lines (electrodes) and solder pads 101 in each cell 100 of the plurality of cells 100 have already been fabricated in advance, and the plurality of cells 100 are placed in an order according to parameters such as specifications of the cell string to be prepared.

In some embodiments, each of the plurality of cells 100 includes, but is not limited to, any one of a passivated emitter and rear cell (PERC) cell, a passivated emitter and rear totally-diffused (PERT) cell, a tunnel oxide passivated contact (TOPCon) cell, a heterojunction technology (HIT/HJT) cell, and an interdigitated back contact (IBC) cell.

In some embodiments, the cell 100 may be a monocrystalline silicon solar cell, a polysilicon solar cell, an amorphous silicon solar cell, or a multicomponent compound solar cell. The multicomponent compound solar cell may be in particular a cadmium sulfide solar cell, a gallium arsenide solar cell, a copper indium selenium solar cell, or a perovskite solar cell.

At least part (at least one cell 100) of the plurality of cells 100 are selected from the plurality of cells 100 and for each cell of the selected at least one cell 100, a corresponding solder layer 102 is formed on each respective solder pad of at least a portion (at least one solder pad 101) of solder pads 101 of the plurality of solder pads 101 of the respective cell 100.

After the plurality of cells 100 are provided, at least part of the cells 100 are selected from the plurality of cells 100, and at least a portion of solder pads 101 among the plurality of solder pads 101 included in each cell 100 of the at least part of the selected cells 100 are selected as target solder pads, and a corresponding solder layer 102 is formed on each target solder pad of the selected target solder pads. The formed solder layer 102 includes a first alloy layer 120 close to the solder pad 101 and a second alloy layer 121 located on a surface of the first alloy layer 120 away from the solder pad 101. A first alloy of the first alloy layer 120 is an alloy formed of tin and a metal element constituting the solder pad 101. The second alloy layer 121 may be formed by one or a combination of a tin-lead alloy, a tin-silver alloy, a tin-copper alloy, a tin-lead-silver alloy, or a tin-bismuth alloy that facilitates soldering.

It is to be noted that there is no restriction on the manner in which each of the cell and the solder pad is selected. The selected at least one cell may be part of or all the plurality of cells, and the selected at least one solder pad may be part of or all the plurality of solder pads.

By forming the corresponding solder layer 102 including the first alloy layer 120 and the second alloy layer 121, the spacing between the respective solder pad 101 and a corresponding connecting member 103 is greatly reduced, and the probability of false soldering between the connecting member 103 and the solder pad 101 during the welding is reduced. The first alloy in the first alloy layer 120 of the solder layer 102 is formed of tin and a metal element constituting the solder pad 101, and an alloy layer capable of effectively increasing the soldering strength is formed before the connecting member 103 and the solder pad 101 or the solder layer 102 are soldered, thereby effectively reducing the heating temperature required in the subsequent soldering treatment.

In addition, the at least one cell 100 to which the solder layers 102 are prepared may be part or all of the plurality of cells 100 provided. During forming of the solder layers 102 on the selected at least one cell 100, the solder layers 102 may be formed on only part of the solder pads 101 included in each cell 100, or the solder layers 102 may be formed on all the solder pads 101 included in each cell 100. For ease of understanding, embodiments of the present disclosure are illustrated with the formation of solder layers 102 on all the solder pads 101 in each cell 100 as an example. By adopting a scheme of forming the solder layers 102 on at least part of the solder pads 101 of each cell 100 in advance, instead of the scheme of spraying solder paste on the solder pads 101 during the welding, the problem that conductive foreign matter is generated due to movement of the solder paste or the tin slag is avoided, the safety of cell strings preparation is improved, and the process risk in the cell string in the preparation process is reduced.

In addition, an orthographic projection of each of the solder layers 102 and a corresponding solder pad 101 on a surface of the cell 100 may have a circular shape, elliptical shape, or polygonal shape. In embodiments of the present disclosure, an orthographic projection of each solder pad 101 on the surface of the respective cell 100 is a rectangle, and an orthographic projection of the corresponding solder layer 102 on the surface of the respective cell 100 is a circle.

In some embodiments, each solder layer 102 is formed as follows. Each solder layer 102 having a thickness in a range of 50 μm to 300 μm is formed in a direction perpendicular to the surface of the respective cell 100.

As mentioned in the above description of the preparation of each cell string, the surface of each cell 100 is generally provided with insulating glue dots 110 that isolate the main bus bars and the finger electrodes with different polarities. In the case that the insulating glue dots 110 are provided on the surface of each cell 100, the periphery of each solder pad 101 is no longer in a relatively flat state due to the insulating glue dots 110 during the connection of the adjacent cells 100 by using the connecting member 103, and the laid connecting member 103 may be elevated by the insulating glue dots 110, resulting in a large spacing between the solder pad 101 and the connecting member 103, which may easily lead to false soldering or unstable connection between the subsequent connecting member 103 and the solder pad 101 during forming of electrical connection. The spacing refers to a minimum value of distances between any point on a surface of each connection member 103 after being laid and any point on a corresponding solder pad 101.

One of main functions of the solder layer 102 is to serve as an auxiliary function layer to shorten the spacing between the connecting member 103 and the solder pad 101, thereby improving the electrical connection performance and reliability between the connecting member 103 and the solder pad 101. The thickness of each respective solder layer 102 in the direction perpendicular to the surface of the cell 100 refers to a spacing a (as shown in FIGS. 3A and 3B) between a surface of the respective solder layer 102 away from the cell 100 and a surface of the respective solder layer 102 adjacent to the cell 100 in the direction perpendicular to the surface of the cell 100. On condition that the solder layer 102 is formed, if the thickness of the solder layer 102 in the direction perpendicular to the surface of the cell 100 is too small, the solder layer 102 has a limited effect on shortening the spacing between the connecting member 103 and the solder pad 101, and the solder layer 102 is unable to effectively improve the connection performance between the connecting member 103 and the solder pad 101. If the thickness of the solder layer 102 in the direction perpendicular to the surface of the cell 100 is too large, during the connecting member 103 being connected with the solder pad 101, too much molten solder generated by the solder layer 102 easily flows to other regions on the surface of the cell 100, which may lead to shielding the surface of the cell 100 and even causing short-circuiting of grid lines (electrodes) having different polarities on the cell 100.

Therefore, during forming of each solder layer 102, in the direction perpendicular to the surface of the cell 100, each solder layer 102 having a thickness in a range of 50 μm to 300 μm is formed on the surface of the solder pad 101 away from the cell 100. For example, a solder layer 102 having a thickness of 55 μm, 60 μm, 70 μm, 85 μm, 90 μm, 100 μm, 115 μm, 135 μm, 150 μm, 175 μm, 200 μm, 220 μm, 250 μm, 275 μm, or 290 μm is formed. By controlling the thickness of the solder layer 102 in the direction perpendicular to the surface of the cell 100 within an appropriate range, with aid of the solder layer 102, it is possible to effectively shorten the spacing between the laid connecting member 103 after being laid and the solder pad 101, improve the connection performance and reliability during the electrical connection between the connecting member 103 and the solder pad 101, reduce the probability of false soldering between the connecting member 103 and the solder pad 101, and avoid the problem of light shielding of the cell 100 or even short circuit of electrodes after the solder layer 102 melts, thus improving the connection safety of the cell 100.

In addition, a respective cell 100 has a plurality of solder pads 101 formed on a surface of the respective cell 100, and thicknesses of the solder layers 102 formed on the solder pads 101 of the same cell 100 may be the same or different, and thicknesses of the solder layers 102 formed on solder pads 101 on different cells 100 may be the same or different. Embodiments of the present disclosure does not limit a thickness of a corresponding solder layer 102 formed on each solder pad 101.

In some embodiments, each cell 100 includes main bus bars 301, finger electrodes 302, and insulating glue spots 110 that are formed on the surface of the cell 100. The insulating glue spot 110 is used for isolating the main bus bars 301 and the finger electrodes 302 having different polarities. Each solder layer 102 is formed as follows. Each solder layer 102 having a thickness in a range of 0.5 times to 1.5 times that of a corresponding insulating glue spot 110 is formed in a direction perpendicular to the surface of the cell 100.

Similar to the above description of the thickness of the solder layer 102 in the direction perpendicular to the surface of the cell 100 during the formation of the solder layer 102, one of the main functions of the solder layer 102 is to serve as an auxiliary functional layer to shorten the spacing between the connecting member 103 and the solder pad 101. The thickness of each solder layer 102 in the direction perpendicular to the surface of the cell 100 refers to an spacing a between a surface of the solder layer 102 away from the cell 100 and a surface of the solder layer 102 adjacent to the cell 100 in the direction perpendicular to the surface of the cell 100. A thickness of each insulating glue dot 110 in the direction perpendicular to the surface of the cell 100 refers to a maximum value of intervals between any point on a surface of the insulating glue dot 110 and the surface of the cell 100 in the direction perpendicular to the surface of the cell 100.

If a ratio of a thickness of each solder layer 102 to a thickness of a corresponding insulating glue dot 110 adjacent to the solder layer 102 is too small in the direction perpendicular to the surface of the cell 100, the solder layer 102 has limited effect on shortening the spacing between the connecting member 103 and the solder pad 101, and the solder layer 102 is unable to effectively improve the connection performance between the connecting member 103 and the solder pad 101. If the ratio of the thickness of each solder layer 102 to the thickness of the corresponding insulating glue dot 110 adjacent to the solder layer 102 is too large, during connecting of the connecting member 103 and the solder pad 101, too much molten tin generated by the solder layer 102 easily flows to other regions on the surface of the cell 100, which may shield the surface of the cell 100 and even cause short circuit of the main bus bars 301 and the finger electrodes 302 having different polarities on the cell 100.

Therefore, during forming of each solder layer 102, a solder layer 102 is formed on the surface of the solder pad 101 away from the cell 100 in the direction perpendicular to the surface of the cell 100, where the solder layer 102 has a thickness in a range of 0.5 times to 1.5 times the thickness of the insulating glue dot 110. For example, the solder layer 102 has a thickness of 0.6 times, 0.65 times, 0.75 times, 0.8 times, 0.9 times, 1.0 times, 1.15 times, 1.2 times, 1.25 times, 1.35 times, or 1.45 times the thickness of the insulating glue dot 110. With aid of the solder layer 102, it is possible to effectively shorten the spacing between the laid connecting member 103 and the solder pad 101, improve the connection performance and reliability during the electrical connection between the connecting member 103 and the solder pad 101, reduce the probability of false soldering between the connecting member 103 and the solder pad 101, and avoid the problem of light shielding or even short circuit of the electrodes of the cell 100 caused by melting of the solder layer 102, thereby improving the connection safety of the cell 100.

In some embodiments, each solder layer 102 is formed as follows. Molten solder is coated on the solder pad 101 to form the solder layer 102 after cooling.

During preparing of each solder layer 102, in order to form the solder layer 102 solidified on the surface of the solder pad 101, molten solder heated to a molten state is coated on at least a partial region on the surface of the solder pad 101, such that the solder layer 102 is formed after the molten solder is cooled. The solder layer 102 is formed by coating molten solder on the surface of the solder pad 101, which ensures that the solder layer 102 can be stably solidified on the surface of the solder pad 101 after cooling and prevents the solder layer 102 from falling off or moving. In addition, in a subsequent soldering treatment, the solder layer 102 is formed after the molten solder is cooled, so that a good bonding effect can be achieved between the connecting member 103 and the solder pad 101, and the bonding effect and firmness between the connecting member 103 and the solder pad 101 can be improved.

Furthermore, the solder layer 102 includes a first alloy layer 120 adjacent to the solder pad 101 and a second alloy layer 121 located on a surface of the first alloy layer 120 away from the solder pad 101, and the first alloy layer 120 includes a first alloy formed of tin and a metal element constituting the solder pad 101. The first alloy layer 120 and the second alloy layer 121 may be formed by applying molten solder one time, the first alloy layer 120 is formed on the solder pad 101 by means of a high temperature molten solder, and the second alloy layer 121 is formed on a surface of the first alloy layer 120 away from the solder pad 101. Alternatively, the first alloy layer 120 may be formed by first coating a molten first alloy on the surface of the solder pad 101, and then the second alloy layer 121 may be formed by coating molten solder on the surface of the first alloy layer 120 away from the solder pad 101. For another example, solder is first coated on the surface of the solder pad 101 and then the solder is heated and melted to form molten solder, and the first alloy layer 120 and the second alloy layer 121 may be formed by the high temperature of the molten solder. Embodiments of the present disclosure are not limited to the specific manner in which the solder layer 102 is prepared.

In some embodiments, each solder layer 102 is formed as follows. Molten solder is coated on the solder pad 101 using a tin feeder or tinning machine.

During forming of the solder layer 102 on the solder pad 101, a position of each of solder pads 101 on each cell 100 where the solder layer 102 needs to be prepared is determined, and each solder pad 101 where the solder layer 102 needs to be prepared is marked. Thereafter, a target position marking is performed on a control end of the tin feeder or the tinning machine according to the position of the marked solder pad 101. Each cell 100 is transferred to the tin feeder or the tinning machine. After the solder is heated to a molten state in advance by the tin feeder or the tinning machine, the molten solder is coated to a preset position on the surface of the cell 100, that is, a position where the marked solder pad 101 is located, so that a solder layer 102 is formed after the molten solder is cooled.

It is to be noted that there is no restriction on the manner of the marking of the target position where the solder layer 102 needs to be prepared (i.e., the solder coating needs to be performed). In embodiments of the disclosure, any manner can be used to perform the target position marking as long as the target position where the solder layer 102 needs to be prepared is marked.

By coating molten solder on the solder pad 101 using the tin feeder or the tinning machine, not only the position of the molten solder coated can be accurately controlled to form the solder layer 102 on the specific solder pad 101, but also the amount of solder used in the preparation of the solder layer 102 can be accurately controlled. In addition, the cost of solder is usually less than 0.2 yuan/gram, while the cost of solder paste is usually greater than 0.3 yuan/gram, and it is difficult to accurately control the amount of solder paste during spot spraying or screen printing of solder paste, while the control of the amount of the solder during preparation of the solder layer 102 by the tin feeder and the tinning machine is more accurate. Therefore, the overall cost of the cell string preparation can be reduced when tin is coated by the tin feeder or the tinning machine.

In addition, during the tin coating, the amount of the solder in a single solder coating process can be controlled at the control end of the tin feeder or the tinning machine according to a target thickness of the solder layer 102 to be formed, so that the solder layer 102 with a thickness within a specific range can be accurately formed on each solder pad of at least part of the selected solder pads 101 on the surface of the cell 100, thus avoiding the potential safety hazard caused by excessive amount of the molten solder coated and the problem that the false soldering between the connecting member 103 and the solder pad 101 is not improved due to a small amount of the molten solder coated. Compared with the scheme of spraying solder paste on the solder pad 101, during preparing of the solder layer 102 by using the tin feeder or the tinning machine, the amount of solder used in forming each solder layer 102 can be more accurately controlled, and quantitative control and verification are also convenient.

Furthermore, when the solder layer 102 is prepared by using the tin feeder, an automatic tin feeder with high-frequency eddy current heating can be selected, and when the solder layer 102 is prepared by using the tinning machine, an ultrasonic tinning machine can be selected, so that the solder melts more uniformly, and the accuracy of the amount of the solder and the uniformity of molten solder during preparation of the solder layer 102 are further improved.

In some embodiments, a heating temperature for forming molten solder is in a range of 250° C. to 300° C.

In the process of coating the molten solder on the solder pad 101, the solder needs to be heated in advance so that the solder melts to form molten solder for easy coating. In the process of directly forming the solder layer 102 including the first alloy layer 120 and the second alloy layer 121 by one-time molten solder coating, a heating temperature for forming the molten solder has a great influence on the formation of the solder layer 102. The heating temperature refers to a peak heating temperature during heating and fusing of the solder to form the molten solder. If the heating temperature for forming the molten solder is too low, the temperature of the molten solder coated to the surface of the solder pad 101 is low, and the first alloy layer 120 is unable to be formed or the thickness of the formed first alloy layer 120 is small, so that the stability of the direct connection between the solder layer 102 and the solder pad 101 may not be effectively guaranteed, and false soldering or falling off of subsequent connection between the connecting member 103 and the solder pad 101 easily occurs. In a case where the heating temperature for forming the molten solder is too high, the temperature of the molten solder coated to the surface of the solder pad 101 is very high, which easily causes structural damage of the solder pad 101, and may also damage the photoelectric conversion performance of the cell 100.

In some embodiments, the thickness of the formed first alloy layer 120 is in a range of 5 μm to 30 μm in a direction perpendicular to the surface of the cell 100.

Therefore, it is necessary to control the heating temperature for forming the molten solder before coating the molten solder, and the heating temperature for forming the molten solder can be set in the range of 250° C. to 300° C. For example, the heating temperature for forming the molten solder can be set to 255° C., 260° C., 270° C., 285° C., or 300° C. By setting the heating temperature for forming the molten solder within a suitable range, the first alloy layer 120 having a suitable thickness can be formed when the molten solder is coated to the surface of the solder pad 101, the degree of bonding stability between the solder layer 102 and the solder pad 101 can be improved, and damage to the structure of the solder pad 101 and the photoelectric conversion performance of the cell 100 can be avoided as much as possible when the solder layer 102 is prepared, thereby ensuring the photoelectric conversion performance of the cell 100 and the reliability of the photovoltaic module.

In some embodiments, for each cell 100, an area of an orthographic projection of each solder pad 101 on a surface of the cell 100 is a first area, and an area of an orthographic projection of a corresponding solder layer 102 on the surface of the cell 100 is a second area. Each solder layer 102 is formed as follows. Each solder layer 102 is formed, where a ratio of the second area to the first area is in a range of 0.25 to 0.6.

One factor affecting the performance and reliability of the connection between the solder pad 101 and the connecting member 103 is the spacing between the connecting member 103 after being laid and the solder pad 101. The larger the spacing, the more difficult it is to establish the connection between the solder pad 101 and the connecting member 103. Another factor affecting the performance and reliability of the connection between the solder pad 101 and the connecting member 103 is a contact area between the connecting member 103 and the solder pad 101 after establishing the connection. The larger the contact area, the more secure the connection, and the smaller the contact resistance during carrier transmission, the lower the transmission loss. The contact area between the connecting member 103 and the solder pad 101 after the connection is established is affected by a size of the solder layer 102. The size of the solder layer 102 refers to a volume of the solder layer 102. According to a volume calculation formula, under the same other conditions, the larger the maximum cross-sectional area of the solder layer 102 in the direction perpendicular to the surface of the cell 100, the larger the volume of the solder layer 102, and the more solder can be provided, such that the larger the contact area after the connection between the connecting member 103 and the solder pad 101 is established.

In the case where the solder layer 102 is a regular or nearly regular uniform three-dimensional film layer, the maximum cross-sectional area of the solder layer 102 in the direction perpendicular to the surface of the cell 100 is approximately equal to an area of an orthographic projection of the solder layer 102 on the surface of the cell 100. A filling ratio of the solder layer 102 to a cavity between the solder pad 101 and the laid connecting member 103 is related to a ratio of the second area that is the area of the orthographic projection of the solder layer 102 on the surface of the cell 100 to the first area that is the area of the orthographic projection of the solder pad 101 where the solder layer 102 is located on the surface of the cell 100. When the ratio of the area of the orthographic projection of the solder layer 102 on the surface of the cell 100 to the area of the orthographic projection of the solder pad 101 on the surface of the cell 100 is too large, the volume of the solder layer 102 is too large, the solder layer 102 is supplied with too much solder in the process of connecting the connecting member 103 to the solder pad 101, and solder may flow to the surface of the cell 100 outside the solder pad 101 easily, which may lead to shielding the cell 100 and even short-circuiting of electrodes with different polarities. When the ratio of the area of the orthographic projection of the solder layer 102 on the surface of the cell 100 to the area of the orthographic projection of the solder pad 101 on the surface of the cell 100 is too small, the volume of the solder layer 102 is too small, the solder provided by the solder layer 102 in the process of connecting the connecting member 103 to the solder pad 101 is too small, and an area of a contact part between the connecting member 103 and the solder pad 101 covering a surface of the solder pad 101 is too small, which may easily lead to unstable connection, excessive contact resistance, and large carrier transmission loss.

Therefore, during preparation of each solder layer 102, each solder layer 102 is formed, where the ratio of the area of the orthographic projection of the solder layer 102 on the surface of the cell 100 to the area of the orthographic projection of the corresponding solder pad 101 on the surface of the cell 100 is in a range of 0.25 to 0.6. For example, the solder layer 102 in which the ratio of the second area to the first area is 0.3, 0.35, 0.45, 0.5, 0.55 or the like is formed. By forming a solder layer 102 in which the ratio of the second area to the first area is within an appropriate range, the solder layer 102 can effectively fill the cavity between the connecting member 103 and the solder pad 101, sufficient solder may be provided to increase the contact area between the solder pad 101 and the connecting member 103, the reliability and stability of the connection between the solder pad 101 and the connecting member 103 can be enhanced, the contact resistance and carrier transmission loss between the solder pad 101 and the connecting member 103 can be reduced, and the probability of shielding or even short circuit of the electrodes caused by solder flowing to the surface of the cell 100 can be reduced, thereby improving the safety and reliability of the cell string.

Furthermore, for a same cell, a ratio of an area of the orthographic projection of any solder pad 101 on the surface of the cell 100 to an area of the orthographic projection of a corresponding solder layer 102 on the surface of the cell 100 may be the same as or different from a ratio of an area of the orthographic projection of another solder pad 101 on the surface of the cell 100 to an area of the orthographic projection of a corresponding solder layer 102 on the surface of the cell 100. For different cells, a ratio of an area of an orthographic projection of each solder pad 101 on a surface of any cell 100 to an area of an orthographic projection of a corresponding solder layer 102 on the surface of any cell 100 may be the same as or different from a ratio of an area of an orthographic projection of each solder pad 101 on a surface of another cell 100 to an area of an orthographic projection of a corresponding solder layer 102 on the surface of the cell 100.

In some embodiments, each solder layer 102 is formed as follows. A solder layer 102 with a second area in a range of 15 square millimeters to 40 square millimeters is formed.

Similar to the above description of the influence of the solder layer 102 on the contact area when the connecting member 103 is connected to the solder pad 101, the size of the area of orthographic projection of the solder layer 102 on the surface of the cell 100 can intuitively reflect the area of the solder layer 102 covering the solder pad 101. When the area of the orthographic projection of the solder layer 102 on the surface of the cell 100 is too large, the volume of the solder layer 102 is too large, so that too much solder can be provided, and solder may easily flow to the surface of the cell 100 outside the solder pad 101, thus shielding the cell 100 and even short-circuiting of electrodes with different polarities. When the area of the orthographic projection of the solder layer 102 on the surface of the cell 100 is too small, the volume of the solder layer 102 is too small, too little solder can be provided, and the area of the contact part between the connecting member 103 and the solder pad 101 covering the surface of the solder pad 101 is too small, which may easily lead to unstable connection and excessive contact resistance and excessive carrier transmission loss.

Therefore, during preparation of each solder layers 102, each solder layer 102 is formed, where an area of the orthographic projection of the solder layer 102 on the surface of the cell 100 is in a range of 15 square millimeters to 40 square millimeters. For example, the solder layer 102 having a second area of 16 square millimeters, 17.5 square millimeters, 20 square millimeters, 22.5 square millimeters, 25 square millimeters, 30 square millimeters, 35 square millimeters, 37.5 square millimeters, etc. is formed. By forming a solder layer 102 with the second area within an appropriate range, the solder layer 102 can effectively fill the cavity between the connecting member 103 and the solder pad 101, provide enough solder to increase the contact area between the solder pad 101 and the connecting member 103, enhance the reliability and stability of the connection between the solder pad 101 and the connecting member 103, reduce the contact resistance and carrier transmission loss between the solder pad 101 and the connecting member 103, and reduce the probability of shielding or even electrode short circuit caused by solder flowing to the surface of the cell 100, thus improving the safety and reliability of the cell string.

Furthermore, for a same cell, an area of an orthographic projection of any solder layer 102 on the surface of the cell 100 may be the same as or different from an area of an orthographic projection of another solder layer 102 on the surface of the cell 100, and for different cells, an area of an orthographic projection of each solder layer 102 on the surface of any cell 100 may be the same as or different from an area of an orthographic projection of a corresponding solder layer 102 on the surface of another cell 100.

A plurality of connecting members 103 are assembled on pairs of adjacent cells 100, where each respective connecting member 103 is placed on a plurality of solder pads 101 and/or a plurality of solder layers 102 of each cell of a respective pair of adjacent cells 100. A soldering treatment is performed on the respective connecting member 103, and the plurality of solder pads 101 and/or the plurality of solder layers 102 to connect the respective pair of adjacent cells 100, where a heating temperature for the soldering treatment is in a range of 200° C. to 300° C.

During the preparation of each cell string, after the plurality of cells 100 are arranged in a specific order, a plurality of connecting members 103 are provided, where each connecting member 103 is placed on a plurality of solder pads 101 and/or a plurality of solder layers on a main bus bar of each cell 100 of the two adjacent cells 100, and then a soldering treatment is performed on each connecting member 103 and the plurality of solder pads 101 and/or the plurality of solder layers 102. During the soldering treatment, the heating temperature for the soldering treatment is controlled within a range of 200° C. to 300° C. The heating temperature for the soldering treatment refers to a peak temperature of heating during soldering treatment. During the soldering treatment, the heating temperature can be set at 210° C., 225° C., 240° C., 255° C., 275° C., or 290° C.

Furthermore, in order to further improve the soldering effect between the connecting member 103 and the solder pad 101, the heating temperature for the soldering treatment can be controlled in a range of 200° C. to 300° C. when the soldering treatment is performed between each solder pad 101 on which the solder layer 102 is formed and the connecting member 103, and the heating temperature for the soldering treatment can be raised to more than 300° C. when the soldering treatment is performed between each solder pad 101 on which no solder layer 102 is formed and the connecting member 103, thereby improving the reliability of the formed connection structure. In this way, it is possible to reduce the performance damage to the cell 100, and improve the welding yield of the cell string.

The main function of each first alloy layer 120 is to improve the bonding stability between the connecting member 103 and a corresponding solder pad 101. Generally, in order to ensure that the first alloy layer 120 can be formed during the soldering treatment, the heating temperature during the soldering treatment is much higher than 300° C. If the heating temperature is too large, the structure of the solder pad 101 and the photoelectric conversion performance of the cell 100 are easily damaged, and the solder pad 101 may fall off or the cell 100 may be damaged. However, in embodiments of the disclosure, since the first alloy layer 120 is formed in advance during formation of the solder layer 102 before the soldering treatment of the connecting member 103 and the solder pad 101, so that the soldering treatment can be completed at a lower heating temperature during the soldering treatment of the connecting member 103 and the solder pads 101 and/or the solder layers 102, thereby ensuring the connection stability of the connecting member 103 and the solder pads 101, further reducing the probability of unsoldering or false soldering of the connecting member 103 and the solder pads 101, and improving the safety and reliability in the preparation process of the cell string.

In some embodiments, a heating duration for the soldering treatment is 1.2 s to 1.9 s.

During soldering treatment of the connecting member 103 and the solder layers 102 and/or the solder pads 101, the heating duration for the soldering treatment may affect the soldering effect and the reliability of the cell string. If the heating duration for the soldering treatment is too large, the heating duration on the surface of the cell 100 at a high temperature is too large, the solder pad 101 may fall off, and the photoelectric conversion performance of the cell 100 may be damaged. If the heating duration for the soldering treatment is too small, the heating duration for the surface of the cell 100 at a high temperature is too small, the solder layer 102 may not be completely melted or unevenly melted, and the connecting member 103 may not be sufficiently deformed, thereby causing poor connection quality between the connecting member 103 and the solder pads 101 and/or the solder layers 102, such that unsoldering or false soldering may easily occur.

Therefore, during soldering treatment of each connecting member 103 and the corresponding solder pads 101 and/or the corresponding solder layers 102, the heating duration for the soldering treatment can be controlled within the range of 1.2 s to 1.9 s, for example, 1.25 s, 1.3 s, 1.35 s, 1.5 s, 1.65 s, 1.8 s, 1.85 s, etc. By controlling the heating duration for the soldering treatment within an appropriate range and ensuring good soldering quality and connection effect between the connecting member 103 and the solder pads 101 and/or the solder layers 102, the damage to the photoelectric conversion performance of the cell 100 and the structural damage to the solder pad 101 by the soldering treatment are reduced as much as possible, thereby ensuring the photoelectric conversion efficiency of the cell 100 and the structural strength of the solder pad 101 and improving the reliability of the cell string.

In some embodiments, each connecting member 103 includes a conductive core 131 and a wrapping layer 132 covering the conductive core 131, and the wrapping layer 132 has a thickness in a range of 5 μm to 10 μm in a direction perpendicular to a surface where the conductive core 131 is in contact with the wrapping layer 132.

The connecting member 103 includes the internal conductive core 131 and a wrapping layer 132 wrapped outside the conductive core 131 and encapsulating the conductive core 131. The conductive core 131 may be made of a metal having good conductive ability, such as copper, aluminum, silver, or the like. The wrapping layer 132 may be made of a tin-lead alloy, a tin-lead-silver alloy, or a tin-silver alloy that facilitates soldering. During soldering of the connecting member 103 and the solder pads 101 or the solder layers 102, the wrapping layer 132 may melt and flow to the surface of the solder pad 101 or the solder layer 102, so that the connecting member 103 is electrically connected to the solder pad 101. A thickness of the wrapping layer 132 in a direction perpendicular to the surface where the conductive core 131 is in contact with the wrapping layer 132 refers to a spacing between a surface of the wrapping layer 132 in contact with the conductive core 131 and a surface of the wrapping layer 132 far away from the conductive core 131.

If the thickness of the wrapping layer 132 is too large, too much flowability alloy may be formed due to the melting of the wrapping layer 132 during the welding treatment, which may easily cover the region on the surface of the cell 100 outside the pad 101, thereby shielding the cell 100 and even connecting the main bus bar and the finger electrodes with different polarities, resulting in short circuit of the cell 100. If the thickness of the wrapping layer 132 is too small, too little flowability alloy may be formed due to melting of the wrapping layer 132 during the welding treatment, and the problem of insufficient covering area on the surface of the solder pad 101 or more gaps in the formed connection structure easily occurs, resulting in poor stability of the connection between the connecting member 103 and the solder pad 101 and high contact resistance.

Therefore, during providing the plurality of connecting members 103, the connecting members 103 each of which have the wrapping layer 132 having the thickness in a range of 5 μm to 10 μm may be selected, for example, the connecting member 103 of which have the wrapping layer 132 having the thickness of 5.5 μm, 6.5 μm, 7.5 μm, 8.5 μm, or 9.54 μm. By selecting the connecting member 103 having an appropriate thickness of the wrapping layer 132, the bonding effect between the connecting member 103 and the solder pad 101 is ensured, the shielding or short circuit of the cell 100 is avoided, and the reliability and safety of the cell string may be improved.

In addition, compared with the conventional connecting member 103, since the solder layer 102 is formed on the solder pad 101 in advance, the spacing between the connecting member 103 and the solder pad 101 is shortened, and an alloy functional layer having conductive capability is provided. Therefore, the thickness of the wrapping layer 132 of the connecting member 103 is significantly reduced compared with the conventional connecting member 103, and the cost of preparing the connecting member 103 and the cell string is reduced.

In some embodiments, after each solder layer 102 is formed, the method further includes the following. Each cell 100 is sliced to form at least two sub-cells, and each sub-cell of the at least two sub-cells has at least one solder pad 101. The cells 100 are connected with each other as follows. Each connecting member 103 is disposed over corresponding at least one solder pad 101 and/or corresponding at least one solder layer 102 of each sub-cell of two adjacent sub-cells, and a solder treatment is performed on each connecting member 103 and the corresponding at least one solder layer 102 and/or the corresponding at least one solder pad 101 to connect the two adjacent sub-cells.

Each cell 100 may be a full-cell or a slice cell. The slice cell refers to a cell formed after the full-cell being subjected to a cutting process. The cutting process includes: a laser slotting and cutting (LSC) process and a thermal stress cell separation (TMC) process. The advantage of slice cells to form cell strings is that the power generation of the cell strings can be improved by reducing resistance loss. According to Ohm's law, the interconnection electrical loss of the solar cell is proportional to the square of the current. Taking cutting the cell into two halves as an example, the current is reduced by half after slicing, and the electrical loss is also reduced to a quarter of loss of the full-size cell.

Therefore, when the cell 100 is a full-cell, after the solder layer 102 is formed, the cell 100 is sliced to form at least two sub-cells, and each of the at least two sub-cells has at least one solder pad 101. Thereafter, the sub-cell being used as a basic unit for constructing the cell string, each connecting member 103 is placed above the at least one solder pad 101 and/or the at least one solder layer 102 of each of the two adjacent sub-cells, and the welding treatment is performed on each connecting member 103 and the at least one solder layer 102 and/or the at least one solder pad 101 to connect the two adjacent sub-cells. By completing the preparation of the solder layer 102 solidified on the surface of the solder pad 101 before slicing the cell 100, the probability that the solder layer 102 is offset or conductive foreign matter is introduced due to the preparing solder layer 102 in the subsequent processing flow of the cell 100 is as small as possible, and the risk in manufacturing process of the cell string is reduced.

It is to be noted that after slicing the cell 100 in which the preparation of the solder layers 102 is completed, the slice cell formed may be a two-slice cell, a three-slice cell, a four-slice cell, an eight-slice cell, or the like. There is no restriction on the specific manner of slices.

As such, in the method for manufacturing the photovoltaic module provided in some embodiments of the present disclosure, each solder layer 102 including the first alloy layer 120 and the second alloy layer 121 is formed on a corresponding solder pad of at least part of solder pads 101 on each cell of selected at least part of cells 100 in advance, and the first alloy is an alloy formed of tin and a metal element constituting the solder pad 101, and then each connecting member 103 is placed over the at least one solder layer 102 and/or the at least one solder pad 101 on each of the adjacent cells 100, and the adjacent cells 100 are interconnected through a soldering treatment with a heating temperature of 200° C. to 300° C. The solder layer 102 is used to shorten the spacing between the connecting member 103 and the solder pad 101, to improve the stability of the connection and the reliability of the electrical connection between the solder pad 101 and the connecting member 103, and to reduce the probability of false soldering between the connecting member 103 and the solder pad 101. The first alloy layer 120 is included in the pre-formed solder layer 102, which reduces the heating temperature required in the subsequent soldering treatment, makes the heating temperature for the soldering treatment in the range of 200° C. to 300° C., reduces the probability of performance damage of the cell 100 caused by the high temperature in the soldering treatment as much as possible, reduces the possibility of forming conductive foreign matter on the surface of the cell 100, reduces the process risk in the preparation process of the photovoltaic module, and improves the reliability and safety of the photovoltaic module.

Figure 6:
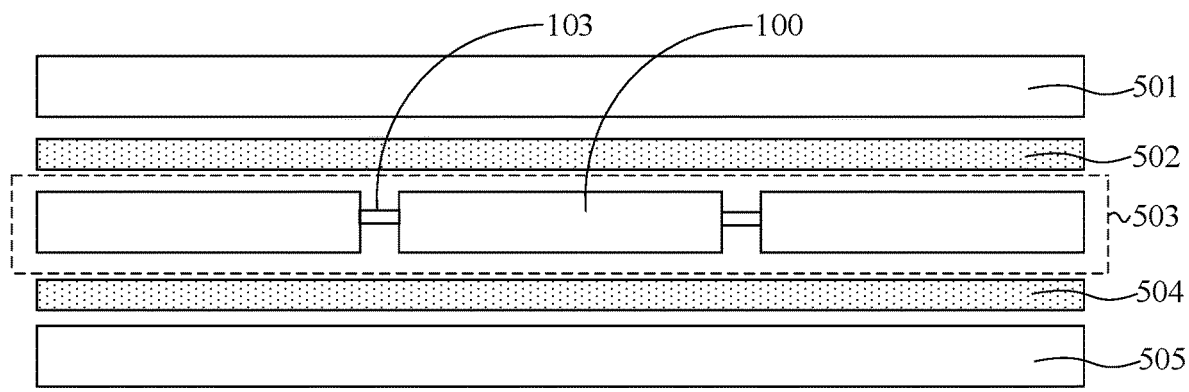
FIG. 6 is an overall schematic structural view of a photovoltaic module according to embodiments of the present disclosure.

Correspondingly, embodiments of the present disclosure further provide a photovoltaic module, and for the structural schematic diagram of each module in the photovoltaic module, reference may be made to FIGS. 2 to 6, where FIG. 6 is the overall structural schematic diagram of the photovoltaic module.

The photovoltaic module includes a first cover plate 501, a first encapsulation film 502, at least one cell string 503, a second encapsulation film 504, and a second cover plate 505 which are stacked in sequence. Each cell string 503 includes a plurality of cells 100 and a plurality of connecting members 103. Each cell 100 of the plurality of cells 100 has a plurality of solder pads 101, and for each respective cell of at least part (at least one cell) of the cells 100, a corresponding solder layer 102 is formed on each respective solder pad 101 of at least a portion (at least one solder pad) of the plurality of solder pads 101 of the respective cell 100. Each respective connecting member 103 of the plurality of connecting members 103 is located over at least one solder pad 101 and/or at least one solder layer 102 of each cell 100 of a respective pair of adjacent cells 100.

It shall be understood that the current photovoltaic module is a semi-finished photovoltaic module in which the connecting of adjacent cells 100 in the cell string 503 and laminating processes have not been completed, and the finished photovoltaic module can be formed after the adjacent cells 100 are connected through a welding treatment and then the laminating process is performed. In the finished photovoltaic module, the cells 100 are connected as a cell string 503, the connecting member 103 above each cell 100 and the solder pad 101 on the cell 100 are electrically connected by a connection structure formed by welding. The first encapsulation film 502 and the second encapsulation film 504 are fused to form an encapsulation film.

In the plurality of cells 100 constituting the photovoltaic module, each solder pad 101 of at least portion of the solder pads 101 on each cell of the at least part of the cells 100 is provided with one solder layer 102. When the adjacent cells 100 are interconnected in a subsequent soldering treatment, the solder layer 102 shortens a spacing between the connecting member 103 and each solder pad 101, thereby reducing the probability of false soldering between the connecting member 103 and the solder pads 101, and improving the reliability of the cell string 203 and the photovoltaic module. In addition, the solder layer 102 being soldered on the surface of the solder pad 101 also reduces the probability of generating conductive foreign matters, thus reducing the process risk of the photovoltaic module.

It is to be noted that in order to avoid repetition, the type and size of each cell can be referred to the description of cells in the implementation examples of the method for manufacturing the photovoltaic module mentioned above, which are not repeated herein. Each cell may be a full-cell or a slice cell. The slice cell refers to a cell formed after the full-cell being subjected to a cutting process. For the manner in which the slice cell is obtained and the interconnection between the slice cells, reference may be made the above method embodiments of the disclosure, which are not repeated herein.

In some embodiments, each solder layer 102 is formed on a corresponding solder pad 101 as follows. Molten solder is coated on the corresponding solder pad 101 by using a tin feeder or a tinning machine.

During forming of each solder layer 102 on the solder pad 101, a position of each of solder pads 101 on each cell 100 where the solder layer 102 needs to be prepared is determined, and for each solder layer 102, the solder pad 101 where the solder layer 102 needs to be prepared is marked. Thereafter, a target position marking is performed on a control end of the tin feeder or the tinning machine according to the position of the marked solder pad 101. Each cell 100 is transferred to the tin feeder or the tinning machine. After the solder is heated to a molten state in advance by the tin feeder or the tinning machine, the molten solder is coated to a preset position on the surface of the cell 100, that is, a position where the marked solder pad 101 is located, so that a solder layer 102 is formed after the molten solder is cooled.

By coating molten solder on the solder pad 101 using the tin feeder or the tinning machine, not only the position of the molten solder applied can be accurately controlled to form the solder layer 102 on the specific solder pad 101, but also the amount of solder used in the preparation of the solder layer 102 can be accurately controlled. In addition, the cost of solder is usually less than 0.2 RMB/gram, while the cost of solder paste is usually greater than 0.3 RMB/gram, and it is difficult to accurately control the amount of solder paste during spot spraying or screen printing of solder paste, while the control of the amount of the solder during preparation of the solder layer 102 by the tin feeder and the tinning machine is more accurate. Therefore, the overall cost of the cell string preparation can be reduced when tin is coated by the tin feeder or the tinning machine.

In addition, during the tin coating, the amount of the solder can be controlled at the control end of the tin feeder or the tinning machine according to a target thickness of the solder layer 102 to be formed in a single solder loading process, so that the solder layer 102 with a thickness within a specific range can be accurately formed on at least part of the selected solder pads 101 on the surface of the cell 100, thus avoiding the potential safety hazard caused by excessive amount of the molten solder coated and the problem that the false soldering between the connecting member 103 and the solder pad 101 is not improved due to a small amount of the molten solder coated. Compared with the scheme of spraying solder paste on the solder pad 101, in the process of preparing the solder layer 102 by using the tin feeder or the tinning machine, the amount of solder used in forming each solder layer 102 can be more accurately controlled, and quantitative control and verification are also convenient.

Furthermore, when the solder layer 102 is prepared by using the tin feeder, an automatic tin feeder with high-frequency eddy current heating can be selected, and when the solder layer 102 is prepared by using the tinning machine, an ultrasonic tinning machine can be selected, so that the solder melts more uniformly before coating, and the accuracy of the amount of the solder and the uniformity of molten solder in the preparation process of the solder layer 102 are further improved.

In some embodiments, a heating temperature for forming molten solder is in a range of 250° C. to 300° C.

In the process of coating the molten solder on the solder pad 101, the solder needs to be heated in advance so that the solder melts to form molten solder for easy coating. The heating temperature refers to a peak heating temperature during heating and fusing of the solder to form the molten solder. Therefore, it is necessary to control the heating temperature for forming the molten solder before coating the molten solder, and the heating temperature for forming the molten solder can be set in the range of 250° C. to 300° C. For example, the heating temperature for forming the molten solder can be set to 255° C., 260° C., 270° C., 285° C., or 300° C. By setting the heating temperature for forming the molten solder within a suitable range, the solder layer 102 having a suitable thickness can be formed when the molten solder is coated to the surface of the solder pad 101, the degree of bonding stability between the solder layer 102 and the solder pad 101 can be improved, and damage to the structure of the solder pad 101 and the photoelectric conversion performance of the cell 100 can be avoided as much as possible when the solder layer 102 is prepared, thereby ensuring the photoelectric conversion performance of the cell 100 and the reliability of the photovoltaic module.

In some embodiments, each cell 100 includes main bus bars 301, finger electrodes 302, and insulating glue spots 110 that are formed on the surface of the cell 100. The insulating glue spot 110 is used for isolating the main bus bars 301 and the finger electrodes 302 having different polarities. In the direction perpendicular to the surface of the cell 100, a thickness of each solder layer 102 is 0.5 times to 1.5 times the thickness of the insulating glue dot 110.

The surface of each cell 100 is generally provided with insulating glue dots 110 that are used for isolating the main bus bars 301 and the finger electrodes 302 with different polarities. In the case that the insulating glue dots 110 are provided on the surface of each cell 100, the periphery of each solder pad 101 is no longer in a relatively flat state due to the insulating glue dots 110 during the connection of the adjacent cells 100 by using the connecting member 103, and the laid connecting member 103 may be elevated by the insulating glue dots 110, resulting in a large spacing between the solder pad 101 and the connecting member 103, which may easily lead to false soldering or unstable connection between the subsequent connecting member 103 and the solder pad 101 during forming of electrical connection. The spacing refers to a minimum value of distances between any point on a surface of each connection member 103 after being laid and any point on a corresponding solder pad 101.

One of main functions of the solder layer 102 is to serve as an auxiliary function layer to shorten the spacing between the connecting member 103 and the solder pad 101, thereby improving the electrical connection performance and reliability between the connecting member 103 and the solder pad 101. The thickness of the solder layer 102 in the direction perpendicular to the surface of the cell 100 refers to an spacing a between a surface of the solder layer 102 away from the cell 100 and a surface of the solder layer 102 adjacent to the cell 100 in the direction perpendicular to the surface of the cell 100. A thickness of each insulating glue dot 110 in the direction perpendicular to the surface of the cell 100 refers to a maximum value of spacings between any point on a surface of the insulating glue dot 110 and the surface of the cell 100 in the direction perpendicular to the surface of the cell 100.

If a ratio of a thickness of each solder layer 102 to a thickness of a corresponding insulating glue dot 110 adjacent to the solder layer 102 is too small in the direction perpendicular to the surface of the cell 100, the solder layer 102 has limited effect on shortening the spacing between the connecting member 103 and the solder pad 101, and the solder layer 102 is unable to effectively improve the connection performance between the connecting member 103 and the solder pad 101. If the ratio of the thickness of each solder layer 102 to the thickness of the corresponding insulating glue dot 110 adjacent to the solder layer 102 is too large, during connecting of the connecting member 103 and the solder pad 101, too much molten tin generated by the solder layer 102 easily flows to other regions on the surface of the cell 100, which may shield the surface of the cell 100 and even cause short circuit of the main bus bars 301 and the finger electrodes 302 having different polarities on the cell 100.

Therefore, the thickness of each solder layer 102 provided in the direction perpendicular to the surface of the cell 100 is set between 0.5 times and 1.5 times the thickness of the insulating glue dot 110, for example, the solder layer 102 having a thickness of 0.6 times, 0.65 times, 0.75 times, 0.8 times, 0.9 times, 1.0 times, 1.15 times, 1.2 times, 1.25 times, 1.35 times, or 1.45 times the thickness of the insulating adhesive dot 110 is formed. The solder layer 102 effectively shortens the spacing between the laid connecting member 103 and the solder pad 101, improves the connection performance and reliability during the electrical connection between the connecting member 103 and the solder pad 101, reduces the probability of false soldering between the connecting member 103 and the solder pad 101, and avoids the problem of light shielding of the cell 100 or even short circuit of electrodes after the solder layer 102 melts, thus improving the connection safety of the cell 100.

In some embodiments, each solder layer 102 has a thickness in a range of 50 μm to 300 μm in a direction perpendicular to the surface of the cell 100.

One of main functions of the solder layer 102 is to serve as an auxiliary function layer to shorten the spacing between the connecting member 103 and the solder pad 101, thereby improving the electrical connection performance and reliability between the connecting member 103 and the solder pad 101. The thickness of the solder layer 102 in the direction perpendicular to the surface of the cell 100 refers to an spacing a between a surface of the solder layer 102 away from the cell 100 and a surface of the solder layer 102 adjacent to the cell 100 in the direction perpendicular to the surface of the cell 100. On condition that the solder layer 102 is formed, if the thickness of the solder layer 102 in the direction perpendicular to the surface of the cell 100 is too small, the solder layer 102 has a limited effect on shortening the spacing between the connecting member 103 and the solder pad 101, and the solder layer 102 is unable to effectively improve the connection performance between the connecting member 103 and the solder pad 101. If the thickness of the solder layer 102 in the direction perpendicular to the surface of the cell 100 is too large, during the connecting member 103 being connected with the solder pad 101, too much molten solder generated by the solder layer 102 easily flows to other regions on the surface of the cell 100, which may lead to shielding the surface of the cell 100 and even causing short-circuiting of grid lines (electrodes) having different polarities on the cell 100.

Therefore, in the direction perpendicular to the surface of the cell 100, a thickness of each solder layer 102 is set to be in a range of 50 μm to 300 μm, for example, the thickness of the solder layer 102 is set to 55 μm, 60 μm, 70 μm, 85 μm, 90 μm, 100 μm, 115 μm, 135 μm, 150 μm, 175 μm, 200 μm, 220 μm, 250 μm, 275 μm, 290 μm, or the like. By controlling the thickness of the solder layer 102 in the direction perpendicular to the surface of the cell 100 within an appropriate range, the solder layer 102 effectively shortens the overhead spacing between the laid connecting member 103 and the solder pad 101, improves the connection performance and reliability during the electrical connection between the connecting member 103 and the solder pad 101, reduces the probability of false soldering between the connecting member 103 and the solder pad 101, and avoids the problem of light shielding of the cell 100 or even short circuit of electrodes after the solder layer 102 melts, thus improving the connection safety of the cell 100.

In addition, a respective cell 100 has a plurality of solder pads 101 formed on a surface of the respective cell 100, and thicknesses of the solder layers 102 formed on the solder pads 101 of the same cell 100 may be the same or different, and thicknesses of the solder layers 102 formed on the solder pads 101 on different cells 100 may be the same or different. Embodiments of the present disclosure does not limit a thickness of a corresponding solder layer 102 formed on each solder pad 101.

In some embodiments, each solder layer 102 includes a first alloy layer 120 adjacent to the solder pad 101 and a second alloy layer 121 located on a surface of the first alloy layer 120 away from the solder pad 101. The first alloy contained in the first alloy layer 120 is an alloy formed of tin and a metal element constituting the solder pad 101.

The main function of each solder layer 102 is to improve the soldering effect between the connecting member 103 and the solder pad 101 and a main factor reflecting the soldering effect is the connection strength after soldering. When the connecting member 103 and the solder pad 101 are interconnected through soldering treatment, it is usually necessary to heat at a high heating temperature so that the connection structure of the connecting member 103 and the solder pad 101 includes an alloy layer composed of an alloy formed of tin and a metal element on the surface of the solder pad 101, thereby improving the stability of the connection structure and the reliability of the connection between the connecting member 103 and the solder pad 101. If the heating temperature is too high, the structure of the solder pad 101 is easily damaged, and even the photoelectric conversion performance of the cell 100 is damaged, thereby causing the reliability and photoelectric conversion performance of the photovoltaic module to decrease.

Therefore, during preparation of the solder layer 102, the solder layer 102 is prepared as a functional layer including a first alloy layer 120 adjacent to the solder pad 101 and a second alloy layer 121 located on a surface of the first alloy layer 120 away from the solder pad 101. The first alloy contained in the first alloy layer 120 is an alloy formed of tin and a metal element constituting the solder pad 101. By forming the first alloy layer 120 to improve the stability after welding prior to the welding treatment of the connecting member 103 and the solder pad 101, the welding temperature in the subsequent welding treatment can be greatly reduced, thereby reducing possible damage to the structure of the solder pad 101 and the photoelectric conversion performance of the cell 100 during the welding treatment, and improving the reliability of the photovoltaic module.

In addition, the main function of the second alloy layer 121 is to assist the welding treatment, and therefore, the second alloy layer 121 may include one or a combination of a tin-lead alloy, a tin-silver alloy, a tin-copper alloy, a tin-lead-silver alloy, or a tin-bismuth alloy that facilitates soldering.

During preparing of the solder layer 102, molten solder heated to a molten state may be coated to at least a part of a region on the surface of the solder pad 101, tin in the solder and a metal element(s) on the surface of the solder pad 101 are induced to form a first alloy by high temperature of the molten solder, and the first alloy layer 120 and the second alloy layer 121 in the solder layer 102 may be directly formed after the molten solder coated is cooled. Alternatively, the first alloy layer 120 may be formed by first coating a molten first alloy on the surface of the solder pad 101, and then the second alloy layer 121 may be formed by coating molten solder on the surface of the first alloy layer 120 away from the solder pad 101. Alternatively, solder is first coated on the surface of the solder pad 101 and then the solder is heated and melted to form molten solder, such that the first alloy layer 120 and the second alloy layer 121 may be formed by means of high temperature of the molten solder. Embodiments of the present disclosure are not limited to the specific manner in which the solder layer 102 is prepared.

In addition, an orthographic projection of each of the solder layer 102 and the solder pad 101 on a surface of the cell 100 may be circular, elliptical, or polygonal. In embodiments of the present disclosure, an orthographic projection of the solder pad 101 on the surface of the cell 100 is a rectangle, and an orthographic projection of the solder layer 102 on the surface of the cell 100 is a circle.

During performing a soldering treatment on each connecting member 103 and the corresponding at least one solder pad 101 and/or the corresponding at least one solder layer 102 through a soldering process, the heating temperature for the soldering treatment on the at least one solder layer 102 and the connecting member 103 is controlled within a range of 200° C. to 300° C. during the soldering treatment. For example, the heating temperature can be set at 210° C., 225° C., 240° C., 255° C., 275° C., or 290° C. The heating temperature for the soldering treatment refers to a peak temperature of heating during soldering treatment. When the welding treatment is performed on the solder pad 101 and the connecting member 103, the heating temperature for the soldering treatment can be raised to more than 300° C., for example, 350° C., 375° C., or 380° C., thereby improving the reliability of the formed connection structure. Therefore, the performance damage to the cell 100 is reduced as much as possible, the welding yield is improved.

In the plurality of cells 100 constituting the photovoltaic module, each solder pad 101 of at least portion of the solder pads 101 on each cell of the at least part of the cells 100 is provided with one solder layer 102. Each solder layer 102 includes a first alloy layer 120 adjacent to the solder pad 101 and a second alloy layer 121 located on a surface of the first alloy layer 120 away from the solder pad 101. The first alloy is an alloy formed of tin and a metal element constituting the solder pad 101. When interconnection the adjacent cells 100 is realized through a soldering process, the solder layer 102 shortens a spacing between the connecting member 103 and the solder pad 101, thereby reducing the probability of false soldering between the connecting member 103 and the solder pad 101. The solder layer 102 including the first alloy layer 120 and the second alloy layer 121 is soldered on the surface of the solder pad 101, thereby avoiding the generation of conductive foreign matters on the surface of the cell 100 during the interconnecting process of the cells 100 and improving the reliability of the cell string 503. The first alloy layer 120 including a first alloy formed of tin and a metal element constituting the solder pad 101 is formed in advance, so that the heating temperature required during the soldering treatment is greatly reduced, the probability of performance damage to the cell 100 and the structure of the solder pad 101 being damaged is reduced, and the reliability of the cell string 503 is improved.

In some embodiments, each cell 100 includes main bus bars, finger electrodes, and insulating glue spots 110 that are formed on the surface of the cell 100. The insulating glue spot is used for isolating the main bus bars and the finger electrodes having different polarities. In the direction perpendicular to the surface of the cell 100, a thickness of each solder layer 102 is in a range of 0.5 times to 1.5 times the thickness of the insulating glue dot 110.

The surface of each cell 100 has main bus bars, finger electrodes, and insulating glue spots 110. The insulating glue spots 110 may cause the periphery of the solder pad 101 not being in a relatively flat state, resulting in a large spacing between the solder pad 101 and the connecting member 103. The spacing refers to a minimum value of distances between any point on a surface of each connection member 103 after being laid and any point on a corresponding solder pad 101. One of the main functions of the solder layer 102 is to serve as an auxiliary functional layer to shorten the spacing between the connecting member 103 and the solder pad 101. The thickness of the solder layer 102 in the direction perpendicular to the surface of the cell 100 refers to a spacing a between a surface of the solder layer 102 away from the cell 100 and a surface of the solder layer 102 adjacent to the cell 100 in the direction perpendicular to the surface of the cell 100. A thickness of each insulating glue dot 110 in the direction perpendicular to the surface of the cell 100 refers to a maximum value of spacings between any point on a surface of the insulating glue dot 110 and the surface of the cell 100 in the direction perpendicular to the surface of the cell 100.

During forming of the solder layer 102, a solder layer 102 is formed on the surface of the solder pad 101 away from the cell 100 in a direction perpendicular to the surface of the cell 100, where the solder layer 102 has a thickness in a range of 0.5 times to 1.5 times the thickness of the insulating glue dot 110. For example, the solder layer 102 has a thickness of 0.6 times, 0.65 times, 0.75 times, 0.8 times, 0.9 times, 1.0 times, 1.15 times, 1.2 times, 1.25 times, 1.35 times, or 1.45 times the thickness of the insulating glue dot 110. With aid of the solder layer 102, it is possible to effectively shorten the spacing between the laid connecting member 103 and the solder pad 101, improve the connection performance and reliability during the electrical connection between the connecting member 103 and the solder pad 101, reduce the probability of false soldering between the connecting member 103 and the solder pad 101, and avoid the problem of light shielding or even short circuit of the electrodes of the cell 100 caused by melting of the solder layer 102, thereby improving the connection safety of the cell 100.

In some embodiments, the solder layer 102 with a thickness of 50 μm to 300 μm is formed in a direction perpendicular to the surface of the cell 100.

During forming the solder layer 102, in the direction perpendicular to the surface of the cell 100, a solder layer 102 having a thickness of 50 μm to 300 μm is formed on the surface of the solder pad 101 away from the cell 100. For example, a solder layer 102 having a thickness of 55 μm, 65 μm, 75 μm, 95 μm, 100 μm, 125 μm, 145 μm, 175 μm, 200 μm, 225 μm, 255 μm, 270 μm, or 295 μm is formed. With aid of the solder layer 102, it is possible to effectively shorten the spacing between the laid connecting member 103 and the solder pad 101, improve the connection performance and reliability during the electrical connection between the connecting member 103 and the solder pad 101, reduce the probability of false soldering between the connecting member 103 and the solder pad 101, and avoid the problem of light shielding of the cell 100 or even short circuit of electrodes after the solder layer 102 melts, thus improving the connection safety of the cell 100.

In some embodiments, the first alloy layer 120 includes a silver-tin alloy layer, a copper-tin alloy layer, or a gold-tin alloy layer.

The main function of the first alloy layer 120 is to enhance the bonding strength between the connecting member 103 and the solder pad 101 after the soldering treatment, and to reduce the heating temperature during the soldering treatment of the connecting member 103 and the solder pad 101 or the solder layer 102. The reason why the first alloy layer 120 can improve the welding strength between the connecting member 103 and the solder pad 101 is that the first alloy contained in the first alloy layer 120 is an alloy formed of a metal element and tin on a surface where the solder pad 101 contacts with the first alloy layer 120, and has a good bonding effect with the solder pad 101. The first alloy layer 120 may be formed by coating or heating molten solder with a relatively high temperature on the solder pad 101 and reacting tin in the molten solder with a metal element on the surface of the solder pad 101 at a high temperature. Alternatively, the first alloy layer 120 may be formed by melting a first alloy formed of tin and a metal element the same as a metal element on the surface of the solder pad 101 in advance and coating the melted first alloy on the surface of the solder pad 101.

The solder pad 101 may be a material, such as, copper, gold, or silver, having good conductivity, or a good conductive material having a functional film layer such as a silver-plated film layer or a gold-plated film layer formed on the surface of the solder pad 101. Therefore, in order to improve the bonding effect between the first alloy layer 120 and the solder pad 101, it is possible to selectively form the first alloy layer 120 of an appropriate material according to the metal elements on the surface of the solder pad 101 facing the solder layer 102. For example, in the case where the solder pad 101 is made of silver, the first alloy layer 120 may be an alloy layer including a silver-tin alloy. In a case where the solder pad 101 is made of copper, the first alloy layer 120 may be an alloy layer including a copper-tin alloy. In the case where the solder pad 101 is made of copper and has a silver-plated film layer on the side facing the solder layer 102, the first alloy layer may be an alloy layer including a silver-tin alloy. By forming the corresponding first alloy layer 120 according to the material and structure of the solder pad 101, the bonding strength and effect between the solder pad 101 and the connecting member 103 can be improved as much as possible, and the stability of the photovoltaic module can be improved.

Therefore, the first alloy layer 120 may be a silver-tin alloy layer, a copper-tin alloy layer or a gold-tin alloy layer depending on the commonly used material of the solder pad 101 and the commonly used coating on the surface of the solder pad 101.

Furthermore, the first alloy layer 120 may contain only one alloy or a plurality of alloys, which is not limited in embodiments of the disclosure.

By selectively forming a first alloy layer consisting of a first alloy formed of tin and a metal element on the surface of the solder pad 101 according to a material of the solder pad 101 or a coating on the surface of the solder pad 101, the first alloy layer 120 for enhancing the connection strength between the connecting member 103 and the solder pad 101 is formed in advance, the heating temperature during the subsequent soldering treatment can be effectively reduced, the probability of damage to the cell 100 and the solder pad 101 during the soldering treatment is reduced, such that the safety and reliability of the photovoltaic module can be improved.

In some embodiments, each first alloy layer 120 has a thickness of 5 μm to 30 μm in a direction perpendicular to the surface of the cell 100.

The thickness of each first alloy layer 120 in the direction perpendicular to the surface of the cell 100 refers to an spacing between a surface where the first alloy layer 120 contacts a corresponding solder pad 101 and a surface where the first alloy layer 120 is away from the corresponding solder pad 101. One of the main functions of the first alloy layer 120 is to enhance the connection strength between the connecting member 103 and the solder pad 101. If the thickness of the first alloy layer 120 is too large, the temperature of the molten solder coated for forming the first alloy layer 120 is high or the volume of the first alloy in the molten state is too large, and excessive heat is transferred to the cell 100 and the solder pad 101, so that the surface of the solder pad 101 has a large volume of high-temperature molten material. As a result, the solder pad 101 is structurally damaged, and the photoelectric conversion performance of the cell 100 is damaged. If the thickness of the first alloy layer 120 is too small, the temperature of molten solder coated for forming the first alloy layer 120 is relatively low or the volume of the first alloy in the molten state is small, and the strength and structure of the first alloy layer 120 are relatively weak, and the improvement effect on the bonding strength between the connecting member 103 and the solder pad 101 is limited.

Therefore, the thickness of the first alloy layer 120 in the direction perpendicular to the surface of the cell 100 is set in a range of 5 μm to 30 μm, for example, the thickness of the first alloy layer 120 is set to 6 μm, 7.5 μm, 9 μm, 10 μm, 12.5 μm, 15 μm, 17.5 μm, 18 μm, 22.5 μm, 25 μm, 27.5 μm, 28 μm, or 29 μm, or the like. By setting the thickness of the first alloy layer 120 within an appropriate range, the problems of damage to the solder pad 101 and the cell 100 during the preparation treatment of the first alloy layer 120, or even causing the solder pad to fall off, are avoided, the reliability of the photovoltaic module is improved. In addition, the connection strength between the connecting member 103 and the solder pad 101 is effectively improved, and the probability of false soldering or unsoldering between the connecting member 103 and the solder pad 101 is reduced.

It is to be noted that for a same cell 100, a thickness of a first alloy layer 120 in any solder layer 102 on the cell 100 may be the same as or different from a thickness of a first alloy layer 120 in another solder layer 102 on the cell 100. For different cells 100, a thickness of a first alloy layer 120 in a solder layer 102 on any cell 100 may be the same as or different from a thickness of a first alloy layer 120 in a solder layer 102 on another cell 100.

In some embodiments, the second alloy layer 121 is a tin-lead alloy layer, where a mass ratio of tin to lead in the tin-lead alloy layer is in a range of 0.25 to 1.

The main function of the second alloy layer 121 is to assist the soldering treatment between the connecting member 103 and the solder layer 102. On the basis that the first alloy layer 120 has been formed in advance, the second alloy layer 121 may be an alloy layer having a lower melting point, and the second alloy layer 121 may be provided as a tin-lead alloy layer having a good soldering performance for consideration of cost and soldering performance.

The melting point of the tin-lead alloy is related to the mass ratio of tin to lead in the alloy layer. In the tin-lead alloy, the higher the lead content is, the higher the melting point of the alloy is, and the lower the lead content is, the lower the melting point of the alloy is. When the mass ratio of tin to lead in the second alloy layer 121 is too small, the melting point of the second alloy layer 121 is too large, and a large heating temperature is required during the soldering treatment, thus easily causing damage to the structure of the solder pad 101 and the photoelectric conversion performance of the cell 100. When the mass ratio of tin to lead is too large, the fluidity of the second alloy in the molten state is too strong, and the second alloy in the molten state is easy to flow to the region outside the solder pad 101, thus increasing the process risk.

Therefore, in the case where the second alloy layer 121 is a tin-lead alloy layer, the mass ratio of tin to lead in the second alloy layer 121 is set in the range of 0.25 to 1, for example, the mass ratio of tin to lead in the second alloy layer 121 is set to 0.26, 0.28, 0.33, 0.35, 0.4, 0.45, 0.5, 0.575, 0.65, 0.75, 0.8, 0.9, or the like. By setting the mass ratio of tin and lead in the second alloy layer 121 within a suitable range, the second alloy layer 121 can effectively assist the soldering treatment of the connecting member 103, and the process risk of the second alloy layer 121 can be reduced, thereby improving the reliability of the photovoltaic module.

In some embodiments, an area of an orthographic projection of each solder pad 101 on a surface of the cell 100 is a first area, and an area of an orthographic projection of a corresponding solder layer 102 on the surface of the cell 100 is a second area, and a ratio of the second area to the first area is 0.25 to 0.6.

One factor affecting the performance and reliability of the connection between the solder pad 101 and the connecting member 103 is the spacing between the connecting member 103 after being laid and the solder pad 101. The larger the spacing, the more difficult it is to establish the connection between the solder pad 101 and the connecting member 103. Another factor affecting the performance and reliability of the connection between the solder pad 101 and the connecting member 103 is a contact area between the connecting member 103 and the solder pad 101 after establishing the connection. The larger the contact area, the more secure the connection, and the smaller the contact resistance during carrier transmission, the lower the transmission loss. The contact area between the connecting member 103 and the solder pad 101 after the connection is established is affected by a size of the solder layer 102. The size of the solder layer 102 refers to a volume of the solder layer 102. According to a volume calculation formula, under the same other conditions, the larger the maximum cross-sectional area of the solder layer 102 in the direction perpendicular to the surface of the cell 100, the larger the volume of the solder layer 102, and the more solder can be provided, such that the larger the contact area after the connection between the connecting member 103 and the solder pad 101 is established.

In the case where the solder layer 102 is a regular or nearly regular uniform three-dimensional film layer, the maximum cross-sectional area of the solder layer 102 in the direction perpendicular to the surface of the cell 100 is approximately equal to an area of a orthographic projection of the solder layer 102 on the surface of the cell 100. A filling ratio of the solder layer 102 to a cavity between the solder pad 101 and the laid connecting member 103 is related to a ratio of the second area that is the area of the orthographic projection of the solder layer 102 on the surface of the cell 100 to the first area that is the area of the orthographic projection of the solder pad 101 where the solder layer 102 is located on the surface of the cell 100. When the ratio of the area of the orthographic projection of the solder layer 102 on the surface of the cell 100 to the area of the orthographic projection of the solder pad 101 on the surface of the cell 100 is too large, the volume of the solder layer 102 is too large, the solder layer 102 is supplied with too much solder in the process of connecting the connecting member 103 to the solder pad 101, and solder may flow to the surface of the cell 100 outside the solder pad 101 easily, which may lead to shielding the cell 100 and even short-circuiting of electrodes with different polarities. When the ratio of the area of the orthographic projection of the solder layer 102 on the surface of the cell 100 to the area of the orthographic projection of the solder pad 101 on the surface of the cell 100 is too small, the volume of the solder layer 102 is too small, the solder provided by the solder layer 102 in the process of connecting the connecting member 103 to the solder pad 101 is too small, and an area of a contact part between the connecting member 103 and the solder pad 101 covering a surface of the solder pad 101 is too small, which may easily lead to unstable connection, excessive contact resistance, and large carrier transmission loss.

The ratio of the area of the orthographic projection of each solder layer 102 on the surface of the cell 100 to the area of the orthographic projection of the corresponding solder pad 101 on the surface of the cell 100 is related to a contact effect of the connecting member 103 and the solder pad 101 after the soldering treatment. During the preparation of each solder layer 102, each solder layer 102 is formed, where the ratio of the area of the orthographic projection of the solder layer 102 on the surface of the cell 100 to the area of the orthographic projection of the corresponding solder pad 101 on the surface of the cell 100 is in a range of 0.25 to 0.6. For example, the solder layer 102 in which the ratio of the second area to the first area is set to 0.25, 0.3, 0.35, 0.375, 0.45, 0.525, 0.5, or 0.55, or the like. By setting the ratio of the second area to the first area within an appropriate range, the solder layer 102 can effectively fill the cavity between the connecting member 103 and the solder pad 101, sufficient solder may be provided to increase the contact area between the solder pad 101 and the connecting member 103, the reliability and stability of the connection between the solder pad 101 and the connecting member 103 can be enhanced, the contact resistance and carrier transmission loss between the solder pad 101 and the connecting member 103 can be reduced, and the probability of shielding or even short circuit of the electrodes caused by solder flowing to the surface of the cell 100 can be reduced, thereby improving the safety and reliability of the cell string.

Furthermore, for a same cell, a ratio of an area of the orthographic projection of any solder pad 101 on the surface of the cell 100 to an area of the orthographic projection of a corresponding solder layer 102 on the surface of the cell 100 may be the same as or different from a ratio of an area of the orthographic projection of another solder pad 101 on the surface of the cell 100 to an area of the orthographic projection of a corresponding solder layer 102 on the surface of the cell 100. For different cells, a ratio of an area of an orthographic projection of each solder pad 101 on a surface of any cell 100 to an area of an orthographic projection of a corresponding solder layer 102 on the surface of any cell 100 may be the same as or different from a ratio of an area of an orthographic projection of each solder pad 101 on a surface of another cell 100 to an area of an orthographic projection of a corresponding solder layer 102 on the surface of the cell 100.

In some embodiments, the area of the orthographic projection of each solder layer 102 on the surface of the cell 100 is 15 square millimeters to 40 square millimeters.

Similar to the above description of the influence of the solder layer 102 on the contact area when the connecting member 103 is connected to the solder pad 101, the size of the area of orthographic projection of the solder layer 102 on the surface of the cell 100 can intuitively reflect the area of the solder layer 102 covering the solder pad 101. When the area of the orthographic projection of the solder layer 102 on the surface of the cell 100 is too large, the volume of the solder layer 102 is too large, so that too much solder can be provided, and solder may easily flow to the surface of the cell 100 outside the solder pad 101, thus shielding the cell 100 and even short-circuiting of electrodes with different polarities. When the area of the orthographic projection of the solder layer 102 on the surface of the cell 100 is too small, the volume of the solder layer 102 is too small, too little solder can be provided, and the area of the contact part between the connecting member 103 and the solder pad 101 covering the surface of the solder pad 101 is too small, which may easily lead to unstable connection and excessive contact resistance and excessive carrier transmission loss.

The area of the orthographic projection of the solder layer 102 on the surface of the cell 100 is related to the contact area between the connecting member 103 and the solder pad 101 after the welding treatment. During preparing of the solder layer 102, the area of the orthographic projection of the solder layer 102 on the surface of the cell 100 can be set in a range of 15 square millimeters to 40 square millimeters. For example, the area (i.e., the second area) of the orthographic projection of each solder layer 102 on the surface of the cell 100 is set to 16 square millimeters, 16.5 square millimeters, 17.5 square millimeters, 20 square millimeters, 21 square millimeters, 22.5 square millimeters, 25 square millimeters, 30 square millimeters, 35 square millimeters, or 37.5 square millimeters, etc. By forming a solder layer 102 with the second area within an appropriate range, the solder layer 102 can effectively fill the cavity between the connecting member 103 and the solder pad 101, provide enough solder to increase the contact area between the solder pad 101 and the connecting member 103, enhance the reliability and stability of the connection between the solder pad 101 and the connecting member 103, reduce the contact resistance and carrier transmission loss between the solder pad 101 and the connecting member 103, and reduce the probability of shielding or even electrode short circuit caused by solder flowing to the surface of the cell 100, thus improving the safety and reliability of the cell string.

Furthermore, for a same cell, an area of an orthographic projection of any solder layer 102 on the surface of the cell 100 may be the same as or different from an area of an orthographic projection of another solder layer 102 on the surface of the cell 100, and for different cells, an area of an orthographic projection of each solder layer 102 on the surface of any cell 100 may be the same as or different from an area of an orthographic projection of a corresponding solder layer 102 on the surface of another cell 100.

In some embodiments, each connecting member 103 includes a conductive core 131 and a wrapping layer 132 covering the conductive core 131, and the wrapping layer 132 has a thickness in a range of 5 μm to 10 μm in a direction perpendicular to a surface where the conductive core 131 is in contact with the wrapping layer 132.

The connecting member 103 includes the internal conductive core 131 and a wrapping layer 132 wrapped outside the conductive core 131 and encapsulating the conductive core 131. The conductive core 131 may be made of a metal having good conductive ability, such as copper, aluminum, silver, or the like. The wrapping layer 132 may be made of a tin-lead alloy, a tin-lead-silver alloy, or a tin-silver alloy that facilitates soldering. During soldering of the connecting member 103 and the solder pads 101 or the solder layers 102, the wrapping layer 132 may melt and flow to the surface of the solder pad 101 or the solder layer 102, so that the connecting member 103 is electrically connected to the solder pad 101. A thickness of the wrapping layer 132 in a direction perpendicular to the surface where the conductive core 131 is in contact with the wrapping layer 132 refers to an spacing between a surface of the wrapping layer 132 in contact with the conductive core 131 and a surface of the wrapping layer 132 far away from the conductive core 131.

If the thickness of the wrapping layer 132 is too large, too much flowability alloy may be formed due to the melting of the wrapping layer 132 during the welding treatment, which may easily cover the region on the surface of the cell 100 outside the pad 101, thereby shielding the cell 100 and even connecting the main bus bar and the finger electrodes with different polarities, resulting in short circuit of the cell 100. If the thickness of the wrapping layer 132 is too small, too little flowability alloy may be formed due to melting of the wrapping layer 132 during the welding treatment, and the problem of insufficient covering area on the surface of the solder pad 101 or more gaps in the formed connection structure easily occurs, resulting in poor stability of the connection between the connecting member 103 and the solder pad 101 and high contact resistance.

Therefore, the thickness of each wrapping layer 132 can be set in a range of 5 μm to 10 μm. For example, the thickness of each wrapping layer 132 is set to 5.5 μm, 6.5 μm, 7.5 μm, 8.5 μm, or 9.54 μm, etc. By setting the thickness of the wrapping layer 132 within an appropriate range, the welding effect between the connecting member 103 and the solder pad 101 is ensured, and shielding or short circuiting of the cell 100 can be avoided, thereby improving the reliability and safety of the cell string.

In addition, compared with the conventional connecting member 103, since the solder layer 102 is formed on the solder pad 101 in advance, the spacing between the connecting member 103 and the solder pad 101 is shortened, and an alloy functional layer having conductive capability is provided. Therefore, the thickness of the wrapping layer 132 of the connecting member 103 is significantly reduced compared with the conventional connecting member 103, and the cost of preparing the connecting member 103 and the cell string is reduced.

As such, in the photovoltaic module provided in some embodiments of the present disclosure, each cell of the plurality of cells constituting each cell string includes a plurality of solder pads, and a solder layer 102 is formed in advance on each solder pad of at least part of the solder pads 101 on each cell of at least part of the cells 100. Each connecting member 103 is placed over at least one corresponding solder layer 102 and/or at least one corresponding pad 101 on each cell 100 of the adjacent cells 100. Each solder layer is formed on a corresponding solder pad of at least part of the solder pads of each cell of the at least part of the cells in advance, and the spacing between the connecting member 103 and the solder pad 101 is shortened with the solder layer 102, which may improve the stability of the connection between the solder pad 101 and the connecting member 103 and the reliability of the electrical connection, reduce the probability of false soldering between the connecting member 103 and the solder pad 101, and reduce the probability of generating conductive foreign matter in the welding process, thereby improving the reliability and safety of the photovoltaic module.

It is not difficult to find that the cell string 503 in the photovoltaic module described in above embodiments is a cell string 503 formed using the cell string preparation method in the photovoltaic module preparation method embodiment, and the technical details in the method for manufacturing the photovoltaic module described in above embodiments. The technical details in the embodiments of the method for manufacturing the photovoltaic module are also applicable in the embodiments of photovoltaic modules.

Similarly, the technical details mentioned in the embodiments of photovoltaic modules are also applicable in the embodiments of method for manufacturing the photovoltaic module, too.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

Although the present disclosure is disclosed as above with foregoing embodiments, the foregoing embodiments are not intended to limit the claims. Any person skilled in the art may make certain possible changes and modifications without departing from the spirit and scope of the present disclosure. Therefore, the scope of protection of the present disclosure shall be subject to the scope defined in the claims of the present disclosure.

What is claimed is:

1. A photovoltaic module, comprising a first cover plate, a first encapsulation film, at least one cell string, a second encapsulation film, and a second cover plate, which are stacked in sequence; wherein
   each cell string of the at least one cell string includes a plurality of cells and a plurality of connecting members;
   each cell of the plurality of cells has a plurality of solder pads, the plurality of solder pads including a metal, and for each respective cell of at least one cell of the plurality of cells, a corresponding solder layer is formed on each respective solder pad of at least one solder pad of the each respective cell, wherein the corresponding solder layer includes a first alloy layer adjacent to the each respective solder pad and a second alloy layer on a surface of the first alloy layer away from the each respective solder pad, the first alloy layer including a first alloy formed of tin and the metal; and
   each respective connecting member of the plurality of connecting members is disposed on at least one solder pad and/or at least one solder layer of each cell of a respective pair of adjacent cells.

2. The photovoltaic module of claim 1, wherein the each respective cell includes main bus bars, finger electrodes, and insulating glue spots that are formed on a surface of the each respective cell, and each insulating glue dot is used for isolating a corresponding main bus bar and a corresponding finger electrode that have different polarities; and
   the corresponding solder layer has a thickness in a range of 0.5 times to 1.5 times a thickness of an adjacent insulating glue dot in a direction perpendicular to the surface of the each respective cell.

3. The photovoltaic module of claim 1, wherein the corresponding solder layer has a thickness in a range of 50 μm to 300 μm in a direction perpendicular to a surface of the each respective cell.

4. The photovoltaic module of claim 1, wherein the second alloy layer includes at least one of a tin-lead alloy, a tin-silver alloy, a tin-copper alloy, a tin-lead-silver alloy, and a tin-bismuth alloy.

5. The photovoltaic module of claim 1, wherein the first alloy layer includes a silver-tin alloy layer, a copper-tin alloy layer, or a gold-tin alloy layer.

6. The photovoltaic module of claim 1, wherein the first alloy layer has a thickness in a range of 5 μm to 30 μm in a direction perpendicular to a surface of the each respective cell.

7. The photovoltaic module of claim 1, wherein the second alloy layer is a tin-lead alloy layer, and a mass ratio of tin to lead in the tin-lead alloy layer is in a range of 0.25 to 1.

8. The photovoltaic module of claim 1, wherein an area of an orthographic projection of the each respective solder pad on a surface of the each respective cell is a first area, an area of an orthographic projection of the corresponding solder layer on the surface of the each respective cell is a second area, and a ratio of the second area to the first area is in a range of 0.25 to 0.6.

9. The photovoltaic module of claim 1, wherein an area of an orthographic projection of the corresponding solder layer on a surface of the each respective cell is in a range of 15 square millimeters to 40 square millimeters.

10. The photovoltaic module of claim 1, wherein each connecting member includes a conductive core and a wrapping layer covering the conductive core, and the wrapping layer has a thickness in a range of 5 μm to 10 μm in a direction perpendicular to a surface where the conductive core is in contact with the wrapping layer.

* * * * *